US006479203B1

(12) United States Patent
Tashiro et al.

(10) Patent No.: US 6,479,203 B1
(45) Date of Patent: Nov. 12, 2002

(54) DIRECT DRAWING TYPE LITHOGRAPHIC PRINTING PLATE PRECURSOR

(75) Inventors: Hiroshi Tashiro, Shizuoka (JP); Satoshi Hoshi, Shizuoka (JP); Seishi Kasai, Shizuoka (JP); Eiichi Kato, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 219 days.

(21) Appl. No.: 09/648,831

(22) Filed: Aug. 25, 2000

(30) Foreign Application Priority Data

Aug. 26, 1999 (JP) .......................................... 11-240598

(51) Int. Cl.[7] ............................ G03G 7/00; G03F 7/00; B41J 3/407; B41M 5/00; B32B 9/00

(52) U.S. Cl. ......................... 430/104; 430/49; 430/126; 430/200; 101/453; 101/473; 347/106; 428/323; 428/328; 428/330; 428/403; 428/409; 428/425.9; 428/447

(58) Field of Search .......................... 430/49, 104, 126, 430/200; 347/106; 428/323, 330, 328, 403, 409, 425.9, 447; 101/453, 473

(56) References Cited

U.S. PATENT DOCUMENTS

| | | | | |
|---|---|---|---|---|
| 6,183,923 B1 | * | 2/2001 | Kato et al. | 430/49 |
| 6,231,988 B1 | * | 5/2001 | Kato et al. | 430/49 |
| 6,258,512 B1 | * | 7/2001 | Kasai et al. | 430/302 |
| 6,393,985 B1 | * | 5/2002 | Tashiro et al. | 430/49 |

* cited by examiner

*Primary Examiner*—Richard L. Schilling
(74) *Attorney, Agent, or Firm*—Reed Smith LLP

(57) ABSTRACT

A direct drawing type lithographic printing plate precursor comprising a water-resistant support having provided thereon an image receiving layer, wherein the image receiving layer comprises particles having rough surface composed of core particles having on the surfaces thereof fine particles adhered, and a binder resin comprising a complex composed of a resin containing a siloxane bond in which a silicon atom is connected with an oxygen atom and an organic polymer containing a group capable of forming a hydrogen bond with the resin containing a siloxane bond.

According to the use of the direct drawing type lithographic printing plate precursor of the present invention, images free from not only background stain over an entire surface but also dot-like stain can be formed thereon. Also, the direct drawing type lithographic printing plate precursor can prepare a lithographic printing plate providing a great number of printed matter having clear images free from disappearance or distortion of image.

18 Claims, 2 Drawing Sheets

DIRECT DRAWING TYPE LITHOGRAPHIC PRINTING PLATE PRECURSOR

FIELD OF THE INVENTION

The present invention relates to a direct drawing type lithographic printing plate precursor and, more particularly, to a direct drawing type lithographic printing plate precursor capable of providing a printing plate which enables to print a great number of printed matter having clear images free from background stain.

BACKGROUND OF THE INVENTION

Lithographic printing plate precursors which are mainly used at present in the filed of small-scale commercial printing include (1) a direct drawing type lithographic printing plate precursor having a hydrophilic image receiving layer provided on a water-resistant support, (2) a printing plate precursor having provided on a water-resistant support a lipophilic image receiving layer comprising zinc oxide, which is converted into a printing plate by undergoing direct drawing image formation and then oil-desensitizing treatment with an oil-desensitizing solution to render the non-image area hydrophilic, (3) a printing plate precursor of an electrophotographic light-sensitive material having provided on a water-resistant support a photoconductive layer comprising photoconductive zinc oxide, which is converted into a printing plate by undergoing image formation and then oil-desensitizing treatment with an oil-desensitizing solution to render the non-image area hydrophilic, and (4) a printing plate precursor of a silver-halide photographic material having a silver halide emulsion layer provided on a water-resistant support.

With the development of office appliances and the expansion of office automation in recent years, it has been desired in the field of printing to adopt an offset printing system wherein a lithographic printing plate is directly prepared from the direct drawing type printing plate precursor (the foregoing (1)) utilizing various image forming means, e.g., an electrophotographic printer, a thermal transfer printer or an ink jet printer without undergoing any other special treatment for conversion into the printing plate.

A conventional direct drawing type lithographic printing plate precursor comprises a support such as paper, having on one surface side thereof an image receiving layer which is a surface layer provided via an interlayer and on the other surface side thereof a back layer. The interlayer and the back layer are each composed of a water-soluble resin such as PVA or starch, a water-dispersible resin such as a synthetic resin emulsion, and a pigment. The image receiving layer ordinarily comprises an inorganic pigment, a water-soluble resin and a water resisting agent.

Examples of inorganic pigment used include kaolin, clay, alc, calcium carbonate, silica, titanium oxide, zinc oxide, barium sulfate and alumina.

Examples of water-soluble resin used include polyvinyl alcohol (PVA), modified PVA such as carboxylated PVA, starch and derivatives thereof, cellulose derivatives such as carboxymethyl cellulose and hydroxyethyl cellulose, casein, gelatin, polyvinyl pyrrolidone, vinyl acetate-crotonic acid copolymer, and styrene-maleic acid copolymer.

Examples of water resisting agent used include glyoxal, initial condensates of aminoplasts such as melamine-formaldehyde resin and urea-formaldehyde resin, modified polyamide resins such as methylolated polyamide resin, polyamide-polyamine-epichlorohydrin adduct, polyamide epichlorohydrin resin, and modified polyamidepolyimide resin.

In addition to the above described ingredients, it is known that a cross-linking catalyst such as ammonium chloride or a silane coupling agent can also be used.

Further, it is proposed that as a binder resin used in an image receiving layer of a direct drawing type lithographic printing plate precursor, a resin having a functional group capable of forming a carboxy group, a hydroxy group, a thiol group, an amino group, a sulfo group or a phosphono group upon decomposition and being previously crosslinked with heat- or light-curing groups included therein is used as described in JP-A-1-226395, JP-A-1-269593 and JP-A-1-288488 (the term "JP-A" as used herein means an "unexamined published Japanese patent application"), a resin having the above-described functional group is used together with a heat- or light-curing resin as described in JP-A-1-226546, JP-A-1-275191 and JP-A-1-309068, or a resin having the above-described functional group is used together with a curing agent as described in JP-A-1-267093, JP-A-1-271292 and JP-A-1-309067, for the purpose of improving hydrophilicity of the non-image area, film strength of the image receiving layer and printing durability.

It is also proposed that into the image receiving layer, resin particles having a minute particle size of one μm or less and containing a hydrophilic group, for example, a carboxy group, a sulfo group or a phosphono group are incorporated as described in JP-A-4-201387 and JP-A-4-223196, or resin particles having a minute particle size and containing a functional group capable of forming the hydrophilic group as described above upon decomposition are incorporated as described in JP-A-4-319491, JP-A-353495, JP-A-5-119545, JP-A-5-58071 and JP-A-5-69684.

However, for improving printing durability of a printing plate obtained by a conventional manner as described above, if the hydrophobicity of the printing plate is enhanced by adding a large amount of the water resisting agent or by using a hydrophobic resin, printing stains due to the decrease in hydrophilicity occur although the printing durability is improved. On the contrary, the enhancement of hydrophilicity results in lowering of the water resistance to cause deterioration of the printing durability.

In particular, when the printing plate is used under a high temperature condition of 30° C. or more, it has a defect that the surface layer thereof is dissolved in dampening water used for offset printing to result in deterioration of the printing durability and occurrence of printing stain. Moreover, since images are directly drawn on an image receiving layer of a printing plate precursor with oil-based ink in the case of direct drawing type lithography, poor adhesion of the oil-based ink to the image receiving layer causes falling off of the oil-based ink in the image area during printing, thereby deteriorating the printing durability even if the occurrence of printing stains in the non-image area is prevented because of sufficient hydrophilicity. This problem does not yet come to a satisfactory solution.

On the other hand, a printing plate precursor having a hydrophilic layer containing titanium oxide, polyvinyl alcohol and hydrolyzed tetramethoxysilane or tetraethoxysilane) as an image receiving layer has been proposed as described, for example, in JP-A-3-42679 and JP-A-10-268583. As a result of plate-making of such a printing plate precursor to prepare a printing plate and printing using the printing plate, however, it has been found that printing durability of the image is practically insufficient.

SUMMARY OF THE INVENTION

The present invention aims to solve these problems which conventional direct drawing type lithographic printing plate precursors are encountered.

Therefore, an object of the present invention is to provide a direct drawing type lithographic printing plate precursor providing a printing plate free from not only background stain over an entire surface but also dot-like stain.

Another object of the present invention is to provide a direct drawing type lithographic printing plate precursor capable of forming a printing plate which can provide a great number of printed matter having clear images free from background stain and disappearance or distortion of images.

Other objects of the present invention will become apparent from the following description.

It has been found that these objects of the present invention are accomplished with the following direct drawing type lithographic printing plate precursors.

(1) a direct drawing type lithographic printing plate precursor comprising a water-resistant support having provided thereon an image receiving layer, wherein the image receiving layer comprises particles having rough surface composed of core particles having on the surfaces thereof fine particles adhered, and a binder resin comprising a complex composed of a resin containing a siloxane bond in which a silicon atom is connected with an oxygen atom and an organic polymer containing a group capable of forming a hydrogen bond with the resin containing a siloxane bond, (2) the direct drawing type lithographic printing plate precursor as described in item (1) above, wherein an average particle size of the fine particles is ⅓ or less of an average particle size of the core particles, (3) the direct drawing type lithographic printing plate precursor as described in item (1) or (2) above, wherein an average particle size of the particles having rough surface is 15 $\mu$m or less, (4) the direct drawing type lithographic printing plate precursor as described in item (1) above, wherein the particles having rough surface are metallic compound particles having photo-catalytic property and bearing on the surfaces thereof minute flakes of metallic substance, (5) the direct drawing type lithographic printing plate precursor as described in item (4) above, wherein the minute flakes of metallic substance born on the surfaces of the metallic compound particles having photo-catalytic property are minute flakes of elemental metal deposited on the surfaces of the metallic compound particles upon irradiation with an active ray in the presence of a salt of the elemental metal which has an ionization tendency smaller than a hydrogen atom, (6) the direct drawing type lithographic printing plate precursor as described in item (4) or (5) above, wherein the metallic compound particles having photo-catalytic property are particles of a member selected from the group consisting of $TiO_2$, $RTiO_3$ (wherein R represents an alkaline earth metal atom), $AB_{2-x}C_xD_{3-x}E_xO_{10}$ (wherein A represents a hydrogen atom or an alkali metal atom; B represents an alkaline earth metal atom or a lead atom); C represents a rare earth atom; D represents a metal atom belonging to Group 5A of the periodic table; E represents a metal atom belonging to Group 4 of the periodic table; and x represents a number of from 0 to 2), $ZnO_2$, $ZrO_2$, ZnO, $Bi_2O_3$, $WO_3$, $Fe_2O_3$, $Cu_2O$, $V_2O_5$, $MoO_3$, $Al_2O_3$, $Cr_2O_3$, ZnS, $MoS_2$, FeS, CuS, PbS, $MoSe_2$, PbSe, CuSe and SiC, (7) the direct drawing type lithographic printing plate precursor as described in anyone of items (1) to (6) above, wherein the resin containing a siloxane bond is a polymer formed by a hydrolysis polymerization condensation reaction of at least one silane compound represented by the following formula (I):

$$(R^0)_nSi(Y)_{4-n} \qquad (I)$$

wherein $R^0$ represents a hydrogen atoms, a hydrocarbon group or a heterocyclic group; Y represents a hydrogen atom, a halogen atom, —$OR^1$, —$OCOR^2$ or —$N(R^3)(R^4)$ (wherein $R^1$ and $R^2$ each represents a hydrocarbon group; and $R^3$ and $R^4$ which may be the same or different, each represents a hydrogen atom or a hydrocarbon group); and n represents 0, 1 or 2, provided that the Si atom is not connected to three or more hydrogen atoms, and (8) the direct drawing type lithographic printing plate precursor as described in anyone of items (1) to (7) above, wherein the image-receiving layer has a surface smoothness of not less than 30 seconds/10 ml in terms of Bekk smoothness.

BRIEF DESCRIPTION OF THE ACCOMPANYING DRAWINGS

Figure 1:
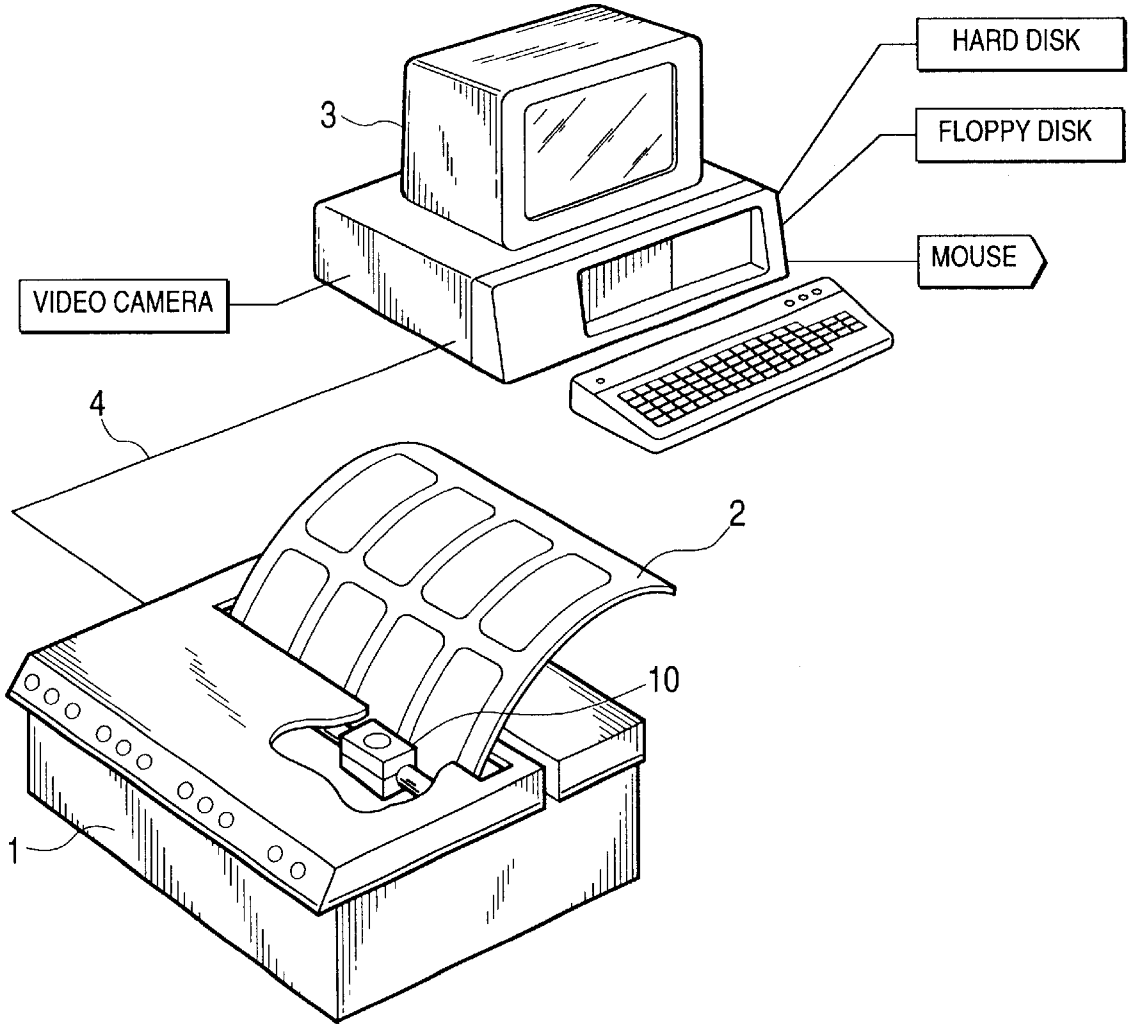
FIG. 1 is a schematic view showing an example of a device system which is used to form an image on the lithographic printing plate precursor according to the present invention.

In these figures, the numerals denote the following members respectively:

1 Ink jet recording device
2 Lithographic printing plate precursor (Master)
3 Computer
4 Bus
5 Video camera
6 Hard disk
7 Floppy disk
8 Mouse
10 Head
**10*a*** Ejection slit
**10*b*** Ejection electrode
**10*c*** Counter electrode
11 Oil-based ink
101 Upper unit
102 Lower unit

DETAILED DESCRIPTION OF THE INVENTION

The present invention also includes a method of preparing a direct drawing type lithographic printing plate precursor comprising irradiating a plate comprising a water-resistant support having provided thereon an image receiving layer, wherein the image receiving layer comprises a salt of metal which has an ionization tendency smaller than a hydrogen atom, metalic compound particles having photo-catalytic property and a binder resin comprising a complex composed of a resin containing a siloxane bond in which a silicon atom is connected with an oxygen atom and an organic polymer containing a group capable of forming a hydrogen bond with the resin containing a siloxane bond with an active ray.

The present invention will be described in greater detail below.

The direct drawing type lithographic printing plate precursor of the present invention is characterized by comprising a water-resistant support having provided thereon an image receiving layer containing particles having rough surface composed of core particles having on the surface thereof fine particles adhered, and a binder resin comprising a complex composed of a resin containing a siloxane bond in which a silicon atom is connected with an oxygen atom and an organic polymer containing a group capable of forming a hydrogen bond with the resin containing a siloxane bond. Since the components have strong interaction with each other, the particles having rough surface are well dispersed in the binder resin of the image receiving layer to provide a printing plate having good printing durability. Further, the particles having rough surface have the specific superfine rough surface structure and due to the specific surface structure, a resin component for image-forming material molten upon heat fixing adheres tightly to the particles having rough surface by an anchoring effect. Thus, since good adhesion of the image to the image receiving layer is achieved, press life of the resulting printing plate is further improved. Also, sufficient amount of dampening water may be supplied at printing and as a result, excellent printed matter is obtained.

Now, the particles having rough surface for use in the image receiving layer of the lithographic printing plate precursor according to the present invention are described in greater detail below.

The particles having rough surface (hereinafter also referred to rough surface particles) are composed of core particles having on the surfaces thereof fine particles adhered.

The core particles for the rough surface particles may be inorganic and organic particles. Suitable examples of the inorganic particles include metal powder, metal oxide particles, metal nitride particles, metal sulfide particles, metal carbide particles and composite particles thereof. Metal oxide particles and metal sulfide particles are preferred. More preferably, particles of glass, $SiO_2$, $TiO_2$, ZnO, $Fe_2O_3$, $ZrO_2$, $SnO_2$, ZnS and CuS are used.

Suitable examples of the organic particles include synthetic resin particles and natural resin particles. Particles of acrylic resin, polyethylene, polypropylene, polyethylene oxide, polypropylene oxide, polyethyleneimine, polystyrene, polyurethane, polyurea, polyester, polyamide, polyimide, carboxymethylcellulose, gelatin, starch, chitin and chitosan are preferred. More preferably, particles of acrylic resin, polyethylene, polypropylene and polystyrene are employed.

An average particle size of the core particles is usually from 0.03 to 10 $\mu$m, preferably from 0.05 to 8 $\mu$m, and more preferably from 0.08 to 5 $\mu$m.

Suitable fine particles for the rough surface particles include inorganic particles, for example, metal powder, metal oxide particles, metal nitride particles and composite particles thereof. Of theses particles, metal powder and metal oxide particles are preferred. More preferably, particles of metal, glass, $SiO_2$, $TiO_2$, ZnO, $Fe_2O_3$, $ZrO_2$ and $SnO_2$ are used.

An average particle size of the fine particles is usually from 0.005 to 3 $\mu$m, preferably from 0.01 to 2 $\mu$m, and more preferably from 0.01 to 1 $\mu$m With respect to a ratio of average particle size of the core particles and fine particles in the rough surface particles, the average particle size of the fine particles is suitably ⅓ or less, preferably ⅕ or less, and more preferably 1/10 or less of the average particle size of the core particles.

An average particle size of the rough surface particles is preferably 15 $\mu$m or less.

A covering rate of the fine particles adhered to the surfaces of the core particles is appropriately selected in a range sufficient for revealing the effect of the present invention. In general, the covering rate is 2% or more, and the surfaces of the core particles may be fully covered with the fine particles. In order to achieve the excellent printing durability, the covering rate is preferably from 5 to 90%, more preferably from 10 to 60%.

The rough surface particles can be prepared, for example, by a method utilizing heterogeneous aggregation as described in Toray Research Center ed., *Biryusi Polymer no Sin-Tenkai* (*New Development of Finely granular Polymers*), a method utilizing a polymerization reaction on the surface of the core particles, or a dry type aggregation stirring method using a hybridizer as described in Funtai Kogaku Kai ed., Ryusi Sekkei Kogaku (Technology of Particle Design). Certain kinds of the rough surface particles are also prepared by a method of depositing the fine particles on the core particles.

An amount of the rough surface particles present in the image receiving layer is preferably from 10 to 95% by weight, more preferably from 20 to 90% by weight based on the total amount of the components in the image receiving layer.

According to one embodiment of the present invention, the rough surface particles are metallic compound particles having photo-catalytic property and bearing on the surface thereof minute flakes of metallic substance.

The metallic compound particles having photo-catalytic property are those which are activated upon irradiation with an active ray to bear a metallic substance which has existed in the neighborhood thereof on the surfaces thereof. Specific examples of the metallic compound particles include $TiO_2$, $RTiO_3$ (wherein R represents an alkaline earth metal atom), $AB_{2-x}C_xD_{3-x}E_xO_{10}$ (wherein A represents a hydrogen atom or an alkali metal atom; B represents an alkaline earth metal atom or a lead atom); C represents a rare earth atom; D represents a metal atom belonging to Group 5A of the periodic table; E represents a metal atom belonging to Group 4 of the periodic table; and x represents a number of from 0 to 2), $SnO_2$, $ZrO_2$, ZnO, $Bi_2O_3$, $WO_3$, $Fe_2O_3$, $Cu_2O$, $V_2O_5$, $MoO_3$, $Al_2O_3$, $Cr_2O_3$, ZnS, $MoS_2$, FeS, CuS, PbS, $MoSe_2$, PbSe, CuSe and SiC.

Titanium oxide ($TiO_2$) for use in the present invention include titanium oxide produced by any known method, for example, baking of ilmenite or titanium slag with sulfuric acid or heat chlorination of ilmenite or titanium sludge and oxidation with oxygen. Any crystal form of titanium oxide can be employed. However, titanium oxide of anatase type is preferred because of its high sensitivity. The titanium oxide of anatase type can be obtained by appropriately selecting conditions during the baking process as well known in the art. Although the titanium oxide of anatase type may contain amorphous titanium oxide and/or titanium oxide of rutile type, it is preferred to use titanium oxide containing anatase type crystal in an amount of 40% by weight or more, preferably 60% by weight or more for the reason described above.

In $RTiO_3$, R represents a metal atom belonging to an alkaline earth group of the periodic table, for example, magnesium, calcium, strontium, barium or beryllium. Particularly, strontium and barium are preferred for R. Two or more kinds of the alkaline earth metal atoms are employed for R as long as the total number thereof coordinates stoichiometrically with the above-described formula.

In the compounds represented by formula $AB_{2-x}C_xD_{3-x}E_xO_{10}$, A represents a monovalent atom selected from a hydrogen atom and an alkali metal atom, for example, sodium, potassium, rubidium, cesium or lithium. Two or more kinds of the monovalent atoms are employed for A as long as the total number thereof coordinates stoichiometrically with the above-described formula.

B represents an alkaline earth metal atom or a lead atom. Two or more kinds of the atoms are employed for B as long as the total number thereof coordinates stoichiometrically with the above-described formula.

C represents a rare earth atom, and preferably includes scandium, yttrium and a lanthanum series atom such as lanthanum, cerium, praseodymium, neodymium, holmium, europium, gadolinium, terbium, thulium, ytterbium or lutetium. Two or more kinds of the atoms are employed for C as long as the total number thereof coordinates stoichiometrically with the above-described formula.

D represents a metal atom belonging to Group 5A of the periodic table, and includes vanadium, niobium and tantalum. Two or more kinds of the atoms belonging to Group 5A of the periodic table are employed for D as long as the total number thereof coordinates stoichiometrically with the above-described formula.

E represents a metal atom belonging to Group 4 of the periodic table and includes, for example, silicon, germanium, tin, lead, titanium and zirconium. Two or more kinds of the atoms belonging to Group 4 of the periodic table are employed for E as long as the total number thereof coordinates stoichiometrically with the above-described formula.

x represents a number of from 0 to 2.

Specific examples of the compound represented by formula $AB_{2-x}C_xD_{3-x}E_xO_{10}$ include $CsLa_2NbTi_2O_{10}$, $HCal_{1.5}Lao_{0.5}Nb_{2.5}Ti_{0.5}O_{10}$ and $LaNbTi_2O_{10}$.

The compounds represented by formula $AB_{2-x}C_xD_{3-x}E_xO_{10}$ can be produced in a known manner. For instance, fine particles of $CsLa_2NbTi_2O_{10}$ are obtained by finely grinding $Cs_2CO_3$, $La_2O_3$, $NbO_5$ and $TiO_2$ in an amount stoichiometrically coordinating with the above formula in a mortar, baking at 130° C. for 5 hours in a platinum crucible, cooling and grinding in a mortar to fine particles of several microns or less. This method is not particularly limited to the production of $CsLa_2NbTi_2O_{10}$ type particles and applied to the production of other particles of $AB_{2-x}C_xD_{3-x}E_xO_{10}$ including $HCa_{1.5}La_{0.5}Nb_{2.5}Ti_{0.5}O_{10}$ and $LaNbTi_2O_{10}$.

The metallic compound particles having photo-catalytic property which are commercially available are also employed.

The metallic compound particles having photo-catalytic property including $TiO_2$, $RTiO_3$, $AB_{2-x}C_xD_{3-x}E_xO_{10}$, $SnO_2$, $ZrO_2$, ZnO, $Bi_2O_3$, $WO_3$, $Fe_2O_3$, $Cu_2O$, $V_2O_5$, $MoO_3$, $Al_2O_3$, $Cr_2O_3$, ZnS, $MoS_2$, FeS, CuS, PbS, $MoSe_2$, PbSe, CuSe and SiC particles are used individually or in a combination of two or more thereof in the image receiving layer.

The metallic substance which is born as a minute flake on the surface of the metallic compound particle having photo-catalytic property reveals preferably hydrophilicity in the state of bearing on the surface of the metallic compound particle. The metallic substance itself may be either hydrophilic or hydrophobic and various kinds of metallic substances can be employed.

The metallic substance which is preferably used in the present invention includes metal of Al, Si, Ti, V, Cr, Mn, Fe, Co, Ni, Cu, Zn, Y, Zr, Mo, Ag, Au, Pt, Pd, Rh, In, Sn and W.

The metallic compound particles having photo-catalytic property and bearing on the surfaces thereof minute flakes of metallic substance can be prepared by subjecting to irradiation with an active ray under a condition that the metallic substance exists in the vicinity of the metallic compound particles having photo-catalytic property. Specifically, when the metallic compound particles having photo-catalytic property are irradiated with an active ray in the presence of a water-soluble salt of the metallic substance, the water-soluble salt is subjected to photo-reduction and metal is deposited in the form of minute flakes on the surfaces of the metallic compound particles having photo-catalytic property.

In order to bear the minute flakes of metal on the surfaces of the metallic compound particles having photo-catalytic property, the metallic compound particles having photo-catalytic property are subjected to irradiation with an active ray in the presence of a metal salt corresponding to the minute flakes of metal (i.e., a precursor of the minute flakes of metal).

The image receiving layer containing the metallic compound particles having photo-catalytic property and bearing on the surfaces thereof the minute flakes of metallic substance dispersed in the binder resin can be prepared in a simple manner. Specifically, there are a method of mixing the metallic compound particles having photo-catalytic property and bearing on the surfaces thereof the minute flakes of metallic substance with the binder resin to form an image receiving layer, a method in which an image receiving layer containing the metallic compound particles having photo-catalytic property is immersed in an aqueous solution of the metal salt and subjected to irradiation with an active ray, a method in which an aqueous solution of the metal salt is impregnated into an image receiving layer containing the metallic compound particles having photo-catalytic property, followed by subjecting to irradiation with an active ray, and a method in which an image receiving layer containing both the metal salt and the metallic compound particles having photo-catalytic property is subjected to irradiation with an active ray. Any of these methods can be employed. In case of using the aqueous solution of metal salt, a concentration of the metal salt in the aqueous solution used is ordinarily from 0.0001 to 10 moles/liter, preferably from 0.001 to 5moles/liter, and more preferably from 0.01 to 3 moles/liter. On the other hand, when the metal salt is impregnated or added to the image receiving layer, a content of the metal salt in the image receiving layer is ordinarily from $1\times10^{-7}$ to $1\times10^{-2}$ mole/m$^2$, preferably from $1\times10^{-6}$ to $5\times10^{-3}$ mole/m$^2$, and more preferably from $1\times10^{-5}$ to $3\times10^{-3}$ mole/m$^2$.

Of the metal constituting the metallic minute flake, that having an ionization tendency smaller than a hydrogen atom, for example, Ag, Au, Cu, Pt, Pd or Rh is preferably used in the methods described above. Particularly, Ag, Au and Cu are preferred.

The water-soluble metal salt which is used for forming the minute flakes of metal includes a nitrate, sulfate, halogenide, halide, halogeno complex salt, ammonia complex salt (an ammoniac aqueous solution of each of the above-described salts) and sulfite.

The active ray means a ray having a wavelength which is absorbed by the metallic compound particles having photo-catalytic property and activates them to generate the catalytic function.

A light source for the active ray is appropriately selected from a mercury lamp such as a high-pressure mercury lamp, a xenon arc lamp, a xenon discharge lamp, various fluorescent lamps, a tungsten lamp, a halogen lamp and a laser beam having an oscillation wavelength in a visible region or ultraviolet region depending on a method of plate-making or the kind of the metallic compound having photo-catalytic property.

Further, a compound which is oxidized with the metallic compound having photo-catalytic property is used at the time of irradiation with an active ray in order to accelerate the deposition of the minute flakes of metallic substance. Suitable examples of the compound used for such a purpose include saccharides or carbohydrates such as malt sugar, milk sugar, dextran, dextrin or soluble starch, aldehydes such as formaldehide, acetaldehide, glyoxal or succindialdehyde, alcohols or phenols having a hydroxy group such as sorbitol, polyethylene glycol or hydroquinone, compounds having a carboxy group such as polyacrylic acid, ethers such as ethylene glycol dimethyl ether, amides such as N-vinyl pyrrolidone, esters such as ethylene glycol monomethyl moncacetate, and ketones such as acetylacetone. An amount of the compound used may be widely varied depending on the kind thereof, but ordinarily from 0.1 to 50% by weight, preferably from 0.5 to 30% by weight, based on the total solid weight of the image receiving layer.

In the above-described embodiment of the present invention, it is desired that the image receiving layer have a light-absorbing function sufficient for effectively generating the light-conversion, that is, density of particles, in addition to the existence of the metallic compound particles having photo-catalytic property. The sufficient light-absorbing function means that the image receiving layer has a spectral absorption region of 0.3 or more in absoptivity in a spectral wavelength range of from 300 to 1,200 nm wherein the light-conversion generates. More specifically, it means that the image receiving layer has an absorption maximum of 0, 3 or more in the absoptivity in a wavelength range of the irradiation ray (in case of using a single wavelength ray, a wavelength range having 100 nm width including the single wavelength as the center). Also, it means that the image receiving layer has a continuous spectral absorption wavelength range of 100 nm or more having the absoptivity of 0.3. When such a condition is satisfied in the image receiving layer, the lithographic printing plate precursor exhibiting excellent hydrophilicity and adhesion to image is obtained by irradiation with a ray having a wavelength which corresponds to the absorption wavelength range described above.

Now, the binder resin used in the image receiving layer of the lithographic printing plate precursor according to the present invention is described in more detail below.

The binder resin employed in the image receiving layer according to the present invention is characterized by comprising a complex composed of a resin containing a siloxane bond in which a silicon atom is connected with an oxygen atom (hereinafter also referred to a siloxane polymer) and an organic polymer containing a group capable of forming a hydrogen bond with the siloxane polymer. The term "complex composed of a siloxane polymer and an organic polymer" means and includes both a sol substance and a gel substance.

The siloxane polymer means a polymer mainly containing a bond composed of "oxygen atom-silicon atom-oxygen atom". The siloxane polymer preferably contains a hydroxy group in a substituent of the main chain and/or at a terminal of the main chain thereof. The siloxane polymer contains a hydrocarbon group, if desired. Thus, the formation of uniform layer and adhesion of the image area are effectively achieved in combination with the rough surface particles and the organic polymer used together.

The siloxane polymer used in the present invention is preferably a polymer obtained by a hydrolysis polymerization condensation reaction of the silane compound represented by formula (I) described above. The hydrolysis polymerization condensation reaction is a reaction wherein a hydrolyzable group is repeatedly subjected hydrolysis and condensation under an acidic or basic condition to polymerize, thereby forming a hydroxy group. The silane compounds can be used individually or as a mixture of two or more thereof.

Now, the silane compound represented by formula (I) will be described in more detail below.

In formula (I), $R^0$ preferably represents a hydrogen atom; a straight chain or branched chain alkyl group having from 1 to 12 carbon atoms (e.g., methyl, ethyl, propyl, butyl, pentyl, hexyl, heptyl, octyl, nonyl, decyl or dodecyl) which may have one or more substituents including, for example, a halogen atom (e.g., chlorine, fluorine or bromine atom), a hydroxy group, a thiol group, a carboxy group, a sulfo group, a cyano group, an epoxy group, an —OR' group (wherein R' represents a hydrocarbon group, e.g., methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N,N-dimethylaminoethyl, 2-bromoethyl, 2-(2-methoxyethyl)oxyethyl, 2-methoxycarbonylethyl, 3-carboxypropyl or benzyl), an —OCOR' group, a —COOR' group, a —COR' group, an $—N(R'')_2$ group (wherein R'', which may be the same or different, each represents a hydrogen atom or a group same as defined for R'), an —NHCONHR' group, an —NHCOOR' group, a $—Si(R')_3$ group, a —CONHR'' group or a —NHCOR' group; a straight chain or branched chain alkenyl group having from 2 to 12 carbon atoms (e.g., vinyl, propenyl, butenyl, pentenyl, hexenyl, octenyl, decenyl or dodecenyl) which may have one or more substituents selected from those described for the foregoing alkyl group; an aralkyl group having from 7 to 14 carbon atoms (e.g., benzyl, phenetyl, 3-phenylpropyl, naphthylmethyl or 2-naphthylethyl) which may have one ore more substituents selected from those described for the foregoing alkyl group; an alicyclic group having from 5 to 10 carbon atoms (e.g., cyclopentyl, cyclohexyl, 2-cyclohexylethyl, 2-cyclopentylethyl, norbornyl or adamantyl) which may have one or more substituents selected from those described for the foregoing alkyl group; an aryl group having from 6 to 12 carbon atoms (e.g., phenyl or naphthyl) which may have one or more substituents selected from those described for the foregoing alkyl group; or a heterocyclic group which may have a condensed ring, containing at least one atom selected from nitrogen, oxygen and sulfur atoms (examples of the hetero ring including a pyran, furan, thiophene, morpholine, pyrrole, thiazole, oxazole, pyridine, piperidine, pyrrolidone, benzothiazole, benzoxazole, quinoline or tetrahydrofuran ring) which may have one or more substituents selected from those described for the foregoing alkyl group.

Y in formula (I) preferably represents a halogen atom (e.g., fluorine, chlorine, bromine or iodine), or a group of formula $—OR^1$, $—OCOR^2$ or $—NR^3R^4$.

In the group of $—OR^1$, $R^1$ represents an aliphatic group having from 1 to 10 carbon atoms which may be substituted (e.g., methyl, ethyl, propyl, butyl, pentyl, hexyl, heptyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxy)ethyl, 2-(N,N-diethylamino)ethyl, 2-methoxypropyl, 2-cyanoethyl, 3-methyloxypropyl, 2-chloroethyl, cyclohexyl, cyclopentyl, cyclooctyl, chlorocyclohexyl, methoxycyclohexyl, benzyl, phenetyl, dimethoxybenzyl, methylbenzyl or bromobenzyl).

In the group of —OCOR$^2$, R$^2$ represents an aliphatic group as defined for R, or an aromatic group having from 6 to 12 carbon atoms which may be substituted (e.g., aryl groups as described for the forgoing R$^0$).

In the group of —NR$^3$R$^4$, R$^3$ and R$^4$, which may be the same or different, each represents a hydrogen atom organ aliphatic group having from 1 to 10 carbon atoms which may be substituted (e.g., aliphatic groups as described for R$^1$ in the foregoing group —OR$^1$). More preferably, the total number of carbon atoms contained in R$^3$ and R$^4$ are 16 or less.

Specific examples of the silane compound represented by formula (I) are set forth below, but the present invention should not be construed as being limited thereto, methyltrichlorosilane, methyltribromosilane, methyltrimethoxysilane, methyltriethoxysilane, methyltriisopropoxysilane, methyltri(tert-butoxy)silane, ethyltrichlorosilane, ethyltribromosilane, ethyltrimethoxysilane, ethyltriethoxysilane, ethyltriisopropoxysilane, ethyltri(tert-butoxy)silane, n-propyltrichlorosilane, n-propyltribromosilane, n-propyltrimethoxysilane, n-propyltriethoxysilane, n-propyltriisopropoxysilane, n-propyltri(tert-butoxy)silane, n-hexyltrichlorosilane, n-hexyltribromosilane, n-hexyltrimethoxysilane, n-hexyltriethoxysilane, n-hexyltriisopropoxysilane, n-hexyltri(tert-butoxy)silane, n-decyltrichlorosilane, n-decyltribromosilane, n-decyltrimethoxysilane, n-decyltriethoxysilane, n-decyltriisopropoxysilane, n-decyltri(tert-butoxysilane), n-octadecyltrichlorosilane, n-octadecyltribromosilane, n-octadecyltrimethoxysilane, n-octadecyltriethoxysilane, n-octadecyltriisopropoxysilane, n-octadecyltri(tert-butoxy) silane, phenyltrichlorosilane, phenyltribromosilane, phenyltrimethoxysilane, phenyltriethoxysilane, phenyltriisopropoxysilane, phenyltri(tert-butoxy)silane, tetrachlorosilane, tetrabromosilane, tetramethoxysilane, tetraethoxysilane, tetraisopropoxysilane, tetrabutoxysilane, dimethoxydiethoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, triethoxyhydrosilane, tribromohydrosilane, trimethoxyhydrosilane, triisopropoxyhydrosilane, tri(tert-butoxy)hydrosilane, vinyltrichlorosilane, vinyltribromosilane, vinyltrimethoxysilane, vinyltriethoxysilane, vinyltriisopropoxysilane, vinyltri(tert-butoxy)silane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri(tert-butoxy)silane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri(tert-butoxy)silane, γ-methacryloxypropylmethyldimethoxysilane, γ-methacryloxypropylmethyldiethoxysilane, γ-methacryloxypropyltrimethoxysilane, γ-methacryloxypropyltriisopropoxysilane, γ-methacryloxypropyltri(tert-butoxy)silane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri(tert-butoxy)silane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri(tert-butoxy)silane, β-(3,4-epoxycyclohexyl) ethyltrimethoxysilane and β-(3,4-epoxycyclohexyl) ethyltriethoxysilane.

In combination with the silane compound represented by formula (I) which is used for the formation of the image receiving layer according to the present invention, a metallic compound capable of forming a film by a sol-gel method such as Ti, Zn, Sn, Zr or Al compound can be employed. Specific examples of the metallic compound usable in combination include $Ti(OR^5)_4$ (wherein R$^5$represents an alkyl group such as methyl, ethyl, propyl, butyl, pentyl, or hexyl), $TiCl_4$, $Zn(OR^5)_2$, $Zn(CH_3COCHCOCH_3)_2$, $Sn(OR^5)_4$, $Sn(CH_3COCHCOCH_3)_4$, $Sn(OCOR^5)_4$, $SnCl_4$, $Zr(OR^5)_4$, $Zr(CH_3COCHCOCH_3)_4$ and $Al(OR^5)_3$.

Now, the organic polymer used in the present invention will be described in more detail below.

The organic polymer contains a group capable of forming a hydrogen bond with the resin containing a siloxane bond as described above. The group capable of forming a hydrogen bond with the siloxane polymer (hereinafter also referred to as specific bond-forming group) preferably includes an amido bond (including a carbonamido bond and a sulfonamido bond), a urethane bond, a ureido bond and a hydroxy group.

The organic polymer contains at least one specific bond-forming group in a main chain and/or a side chain thereof as a repeating unit component. The organic polymer preferably includes a polymer containing, as a repeating unit component, a component having at least one bond selected from —N(R$^{11}$)CO—, —N(R$^{11}$)$S_2O$—, —NHCONH— and —NHCOO— in the main chain or side chain thereof, and a polymer containing, as a repeating unit component, a component having a hydroxy group. In the above-described amido bonds, R$^{11}$ represents a hydrogen atom or an organic residue, and the organic residue includes the hydrocarbon group and heterocyclic group represented by R$^0$ in formula (I).

The organic polymer containing the specific bond-forming group in its main chain according to the present invention includes an amide resin having the —N(R$^{11}$)CO— or —N(R$^{11}$)$SO_2$— bond, a ureido resin having the —NHCONH— bond, and a urethane resin having the —NHCOO— bond.

As diamines and dicarboxylic acids or disulfonic acids used for preparation of the amide resins, diisocyanates used for preparation of the ureido resins and diols used for preparation of the urethane resins, compounds described, for example, in Kobunshi Gakkai ed., *Kobunshi Data Handbook—Kisohen—(Polymer Data Handbook, Fundamental Volume)*, Chapter I, Baifukan (1986), Shinzo Yamashita and Tosuke Kaneko ed., *Kakyozai Handbook* (*Handbook of Cross-linking Agents*), Taiseisha (1981).

Other examples of the polymer containing the amido bond include a polymer containing a repeating unit represented by formula (II) shown below, N-acylated polyalkyleneimine, and polyvinylpyrrolidone and derivatives thereof.

(II)

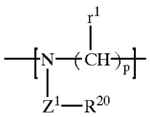

wherein, $Z^1$ represents —CO— —$SO_2$— or —CS—; $R^{20}$ represents a hydrogen atom, a hydrocarbon group or a heterocyclic group (the hydrocarbon group and heterocyclic group having the same meanings as those defined for $R^0$ in formula (I), respectively); $r^1$ represents hydrogen atom or an alkyl group having from 1 to 6 carbon atoms (e.g., methyl, ethyl, propyl, butyl, pentyl or hexyl), $r^1$s may be the same or different; and prepresents an integer of 2 or 3.

Among the polymers containing a repeating unit represented by formula (II), a polymer wherein $Z^1$ represents —CO— and p is 2 can be obtained by ring-opening polymerization of oxazoline which may be substituted in the presence of a catalyst. The catalyst which can be used includes a sulfuric ester or sulfonic ester (e.g., dimethyl sulfate or an alkyl p-toluenesulfonate), an alkyl halide (e.g., an alkyl iodide such as methyl iodide), a fluorinated metallic compound of Friedel-Crafts catalyst, and an acid (e.g., sulfuric acid, hydrogen iodide or p-toluenesulfonic acid) or an oxazolinium salt thereof formed from the acid and oxazoline.

The polymer may be a homopolymer or a copolymer. The polymer also includes a graft polymer containing the units derived from oxazoline in its graft portion.

Specific examples of the oxazoline include 2-oxazoline, 2-methyl-2-oxazoline, 2-ethyl-2-oxazoline, 2-propyl-2-oline, 2-isopropyl-2-oxazoline, 2-butyl-2-oxazoline, 2-chloromethyl-2-oxazoline, 2-trichloromethyl-2-oxazoline, 2-pentafluoroethyl-2-oxazoline, 2-phenyl-2-oxazoline, 2-methoxycarbonylethyl-2-oxazoline, 2-(4-methylphenyl)-2-oxazoline, and 2-(4-chlorophenyl)-2-oxazoline. Preferred examples of the oxazoline include 2-oxazoline, 2-methyl-2-oxazoline, 2-ethyl-2-oxazoline. The oxazolines may be employed individually or as a mixture of two or more thereof.

Other polymers containing a repeating unit represented by formula (II) are also obtained in the same manner as described above except for using thiazoline, 4,5-dihydro-1,3-oxazine or 4,5-dihydro-1,3-thiazine in place of oxazoline.

The N-acylated polyalkyleneimine includes a carboxylic amide compound containing an —N(CO—$R^{20}$)— bond obtained by a polymer reaction of polyalkyleneimine with a carboxylic halide and a sulfonamide compound containing an —N($SO_2$—$R^{20}$)— bond obtained by a polymer reaction of polyalkyleneimine with a sulfonyl halide.

The organic polymer containing the specific bond-forming group in the side chain thereof according to the present invention includes a polymer containing as the main component, a component having at least one group selected from the specific bond-forming groups.

Specific examples of the component having the specific bond-forming group include repeating units derived from acrylamide, methacrylamide, crotonamide and vinyl acetamide, and the repeating units shown below, but the present invention should not be construed as being limited thereto.

(1)

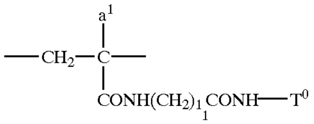

$a^1$: —H, —$CH_3$ $l_1$: an integer from 1 to 4

$T^0$: —H, —$CH_3$, —$(CH_2)_2OCH_3$, —$(CH_2)_2N(CH_3)_2$ (2)

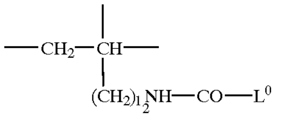

$l_2$: 0 or 1

$L^0$: —$C_{n1}H_{2n1+1}$ ($n_1$: an integer from 1 to 4)

—$(CH_2)_2OCH_3$, —$(CH_2)_3N(CH_3)_2$

—$CH_2C_6H_5$, —$(CH_2)_{n1}OH$ (3)

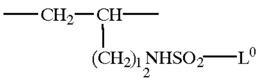

(4)

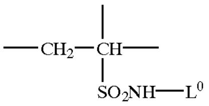

(5)

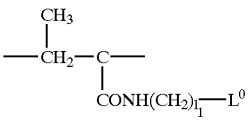

(6)

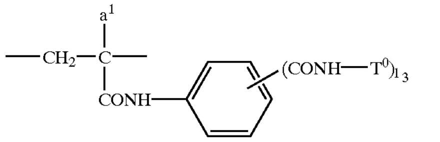

$l_3$: 0, 1 or 2

(7)

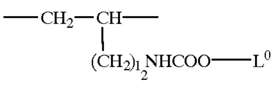

(8)

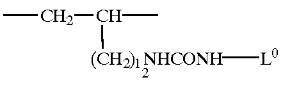

(9)

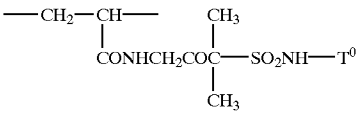

(10)

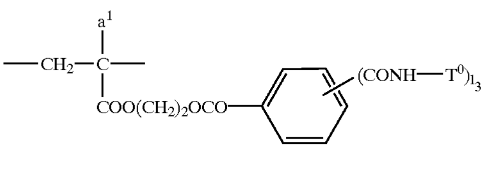

-continued (11)

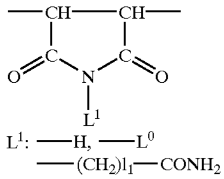

$L^1$: —H, —$L^0$
—$(CH_2)l_1$—$CONH_2$ (12)

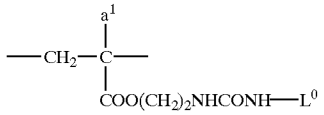

(13)

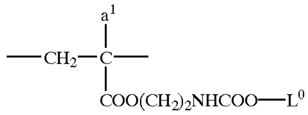

(14)

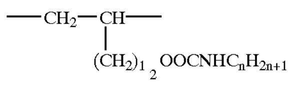

(15)

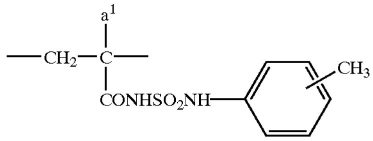

(16)

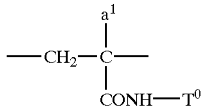

The organic polymer containing a hydroxy group according to the present invention may be any of natural water-soluble polymers, semisynthetic water-soluble polymers and synthetic water-soluble polymers, and include those described, for example, in Munio Kotake supervised, *Daiyuukikagaku 19—Tennen Koubunshi Kagoubutsu I* (*Grand Organic Chemistry 19—Natural Polymer Compounds I*), Asakura Shoten (1960), Keiei Kaihatsu Center Shuppanbu ed., *Suiyousei Koubunshi•Mizubunsangata Jushi Soaogijutsu Shiryo-shuu* (*Water-Soluble Polymers•Aqueous Dispersion Type Resins: Collective Technical Data*), Keiei Kaihatsu Center Shuppanbu (1981), Sinji Nagatomo, *Shin-Suiyousei Polymer no Ouyou to Shijo* (*New Applications and Market of Water-Soluble Polymers*), CMC (1988), and *Kinousei Cellulose no Kaihatsu* (*Development of Functional Cellulose*), CMC (1985).

Specific examples of the natural and semisynthetic water-soluble polymers include cellulose, cellulose derivatives (e.g., cellulose esters such as cellulose nitrate, cellulose sulfate, cellulose acetate, cellulose propionate, cellulose succinate, cellulose butyrate, cellulose acetate succinate, cellulose acetate butyrate or cellulose acetate phthalate; and cellulose ethers such as methylcellulose, ethylcellulose, cyanoethylcellulose, carboxymethylcellulose, hydroxyethylcellulose, hydroxypropylcellulose, ethyl hydroxyethylcellulose, hydroxypropyl methylcellulose or carboxymethyl hydroxyethylcellulose), starch, starch derivatives (e.g., oxidized starch, esterified starch including those esterified with an acid such as nitric acid, sulfuric acid, phosphoric acid, acetic acid, propionic acid, butyric acid or succinic acid; and etherified starch such as methylated starch, ethylated starch, cyanoethylated starch, hydroxyalkylated starch or carboxymethylated starch), alginic acid, pectin, carrageenan, tamarind gum, natural rubber (e.g., gum arabic, guar gum, locust bean gum, tragacanth gum or xanthane gum), pullulan, dextran, casein, gelatin, chitin and chitosan.

Specific examples of the synthetic water-soluble polymer include polyvinyl alcohol, polyalkylene glycols (e.g., polyethylene glycol, polypropylene glycol or ethylene glycol/propylene glycol copolymers), allyl alcohol copolymers, homopolymers or copolymers of acrylate or methacrylate containing at least one hydroxy group (examples of ester portion including a 2-hydroxyethyl, 3-hydroxypropyl, 2,3-dihydroxypropyl, 3-hydroxy-2-hydroxymethyl-2-methylpropyl, 3-hydroxy-2,2-di(hydroxymethyl)propyl, polyoxyethylene and polyoxypropylene group), homopolymers or copolymers of N-substituted acrylamide or methacrylamide containing at least one hydroxy group (examples of N-substituent including a monomethylol, 2-hydroxyethyl, 3-hydroxypropyl, 1,1-bis(hydroxymethyl)ethyl and 2,3,4,5,6-pentahydroxypentyl group). However, the synthetic water-soluble polymer is not particularly limited as long as it contains at least one hydroxy group in the side chain substituent of the repeating unit thereof.

The weight average molecular weight of the organic polymer constituting the complex used in the image-receiving layer according to the present invention is preferably from $1\times10^3$ to $1\times10^6$, more preferably from $5\times10^3$ to $4\times10^5$.

In the complex composed of a siloxane polymer and an organic polymer according to the present invention, a ratio of the siloxane polymer to the organic polymer can be selected from a wide range, and a weight ratio of siloxane polymer/organic polymer is preferably from 10/90 to 90/10, more preferably from 20/80 to 80/20.

In such a range, the desired film-strength and water-resistance of the image receiving layer to dampening water during printing are advantageously effected.

The binder resin comprising the complex of organic polymer and inorganic polymer according to the present invention forms a uniform organic/inorganic hybrid by means of the function of hydrogen bonds generated between hydroxy groups of the siloxane polymer produced by the hydrolysis polymerization condensation of the silane compounds as described above and the above described specific bond-forming groups in the organic polymer and is microscopically homogeneous without the occurrence of phase separation to well maintain affinity between the siloxane polymer and the organic polymer. Also, it is believed that the affinity between the siloxane polymer and the organic polymer is more improved due to the function of the hydrocarbon group included in the siloxane polymer. Further, the complex of the siloxane polymer and the organicpolymer is excellent in a film-formingproperty.

The complex of resins can be prepared by subjecting the silane compound to the hydrolysis polymerization condensation and then mixing with the organic polymer, or by conducting the hydrolysis polymerization condensation of the silane compound in the presence of the organic polymer.

Preferably, the complex of organic polymer and inorganic polymer according to the present invention is prepared by conducting the hydrolysis polymerization condensation of the silane compound in the presence of the organic polymer according to a sol-gel method. In the complex of organic polymer and inorganic polymer thus prepared, the organic polymer is uniformly dispersed in a matrix (i.e., three-dimensional micro-network structure of inorganic oxide) of gel prepared by the hydrolysis polymerization condensation of the silane compound.

The sol-gel method in the present invention may be performed according to any of conventionally well-known sol-gel methods. More specifically, it is conducted with reference to methods described in detail, for example, in *Sol-Gel-ho niyoru Hakumaku Coating Gijutsu* (*Thin Film Coating Technology by Sol-Gel Method*), Gijutsujoho Kyokai (1995), Sumio Sakibana, *Sol-Gel-ho no Kagaku* (*Science of Sol-Gel Method*), Agne Shofusha (1988), and Seki Hirashima, *Saishin Sol-Gel-ho niyoru Kinosei Hakumaku Sakusei Gijutsu* (*Latest Technology of Functional Thin Film Formation by Sol-Gel Method*), Sogo Gijutu Center (1992).

In a coating solution for the image receiving layer, an aqueous solvent is preferably used. A water-soluble solvent is also employed together therewith in order to prevent the occurrence of precipitation during the preparation of coating solution, thereby forming a homogenous solution. Examples of such a water-soluble solvent include an alcohol (such as methanol, ethanol, propyl alcohol, ethylene glycol, diethylene glycol, propylene glycol, dipropylene glycol, ethylene glycol monomethyl ether, propylene glycol monomethyl ether and ethylene glycol monoethyl ether), an ether (such as tetrahydrofuran, ethylene glycol dimethyl ether, propylene glycol dimethyl ether and tetrahydrofuran), a ketone (such as acetone, methyl ethyl ketone and acetylacetone), an ester (such as methyl acetate and ethylene glycol monomethylmonoacetate) and an amide (such as formamide, N-methylformamide, pyrrolidone and N-methylpyrrolidone). These solvents may be used individually or as a mixture of two or more thereof.

In the coating solution, it is preferred to further use an acidic or basic catalyst for the purpose of accelerating the hydrolysis and polymerization condensation reaction of the silane compound represented by formula (I).

The catalyst used for the above purpose is an acidic or basic compound itself or an acidic or basic compound dissolved in a solvent, such as water or an alcohol (hereinafter referred to as an acidic catalyst or a basic catalyst respectively). The concentration of catalyst is not particularly limited, and the high catalyst concentration tends to increase the hydrolysis speed and the polymerization condensation speed. However, since the basic catalyst used in a high concentration may cause precipitation in the sol solution, it is desirable that the basic catalyst concentration be not higher than one normal (iN), as the concentration in the aqueous solution.

The acidic catalyst or the basic catalyst used has no particular restriction as to the species. In a case where the use of a catalyst in a high concentration is required, however, a catalyst constituted of elements which leave no residue in crystal grains obtained after sintering is preferred. Suitable examples of the acidic catalyst include a hydrogen halide (e.g., hydrogen chloride), nitric acid, sulfuric acid, sulfurous acid, hydrogen sulfide, perchloric acid, hydrogen peroxide, carbonic acid, a carboxylic acid (e.g., formic acid or acetic acid), a substituted carboxylic acid (e.g., an acid represented by formula of RCOOH wherein R is an element or a substituent other than —H and $CH_3$—), and a sulfonic acid (e.g., benzenesulfonic acid). Suitable examples of the basic catalyst include an ammoniacal base (e.g., aqueous ammonia) and an amine (e.g., ethylamine or aniline).

In addition to the above described components, the image receiving layer according to the present invention may contain other ingredients.

Examples of other ingredients include inorganic pigment particles other than the specific rough surface particles.

Examples of such an inorganic pigment include silica, alumina, kaolin, clay, zinc oxide, titanium oxide, calcium carbonate, barium carbonate, calcium sulfate, barium sulfate and magnesium carbonate. The inorganic pigment particles are used in a proportion of not higher than 40 parts by weight, preferably not higher than 20 parts by weight, based on 100 parts by weight of the rough surface particles used.

To the image receiving layer, a cross-linking agent may be added for further increasing the film-strength thereof.

The cross-linking agent usable herein include compounds ordinarily used as cross-linking agent. Specifically, such compounds as described, e.g., in Shinzo Yamashita and Tosuke Kaneko ed., *Kakyozai Handbook* (*Handbook of Cross-linking Agents*), Taiseisha (1981) and Kobunshi Gakkai ed., *Kobunshi Data Handbook—Kisohen—*(*Polymer Data Handbook Fundamental Volume*), Baifukan (1986).

Examples of cross-linking agent which can be used include ammonium chloride, metal ions, organic peroxides, polyisocyanate compounds (e.g., toluylene diisocyanate, diphenylmethane diisocyanate, triphenylmethane triisocyanate, polymethylene phenylisocyanate, hexamethylene diisocyanate, isophorone diisocyanate, or high molecular polyisocyanate), polyol compounds (e.g., 1,4-butanediol, polyoxypropylene glycol, polyoxyethylene glycol, or 1,1,1-trimethylolpropane), polyamine compounds (e.g., ethylenediamine, γ-hydroxypropylated ethylenediamine, phenylenediamine, hexamethylenediamine, N-aminoethylpiperazine, or modified aliphatic polyamines), polyepoxy group-containing compounds and epoxy resins (e.g., compounds described in Hiroshi Kakiuchi, *Shin Epoxy Jushi* (*New Epoxy Resins*), Shokodo (1985), and Kuniyuki Hashimoto, Epoxy Jushi (Epoxy Resins), Nikkan Kogyo Shinbunsha (1969)), melamine resins (e.g., compounds described in Ichiro Miwa & Hideo Matsunaga, *Urea•Melamine Jushi* (*Urea•Melamine Resins*), Nikkan Kogyo Shinbunsha (1969)), and poly(meth) acrylate compounds (e.g., compounds described in Makoto Ogawara, Takeo Saegusa & Toshinobu Higashimura, *Oligomer* (*Oligomers*), Kodansha (1976), and Eizo Omori, *Kinousei Acryl Kei Jushi* (*Functional Acrylic Resins*), Techno System (1985)).

The coating solution for the image receiving layer is coated on a water-resistant support using any of conventionally well-known coating methods, and dried to form the image receiving layer.

The thickness of the image receiving layer thus formed is preferably from 0.2 to 10 μm, more preferably from 0.5 to 8 μm. In such a thickness range, the layer formed can have a uniform thickness and sufficient film-strength.

The image-receiving layer according to the present invention preferably has a surface smoothness of not less than 30 (sec/10 ml) in terms of Bekk smoothness.

The term "Bekk smoothness" as used herein means a Bekk smoothness degree measured by a Bekk smoothness tester. In the Bekk smoothness tester, a sample piece is pressed against a circular glass plate having a highly smooth finish and a hole at the center while applying thereto a definite pressure (1 $kg/cm^2$), and a definite volume (10 ml) of air is forced to pass between the sample piece and the glass surface under reduced pressure. Under this condition, a time (expressed in second) required for the air passage is measured.

In a case where images are formed on the lithographic printing plate precursor by means of an electrophotographic printer, an appropriate range of the Bekk smoothness depends on whether toner used in the electrophotographic printer is dry toner or liquid toner.

More specifically, in the case of using dry toner in the electrophotographic printer, it is desirable that the Bekk smoothness of the image receiving layer surface be preferably from 30 to 200 (sec/10 ml), more preferably from 50 to 150 (sec/10 ml). In the above described range, the attachment of scattered toner to the non-image area (resulting in the occurrence of background stain) is prevented and the toner adheres uniformly and firmly to the image area in the process of transferring and fixing the toner image to the printing plate precursor, whereby satisfactory reproduction of fine lines and fine letters and uniformity in the solid image area can be achieved.

In the case of using liquid toner in the electrophotographic printer, it is desirable for the image receiving layer surface to have the Bekk smoothness of not less than 30 (sec/10 ml), and the toner images transferred and fixed thereto can have better quality the higher the Bekk smoothness is. Specifically, the range thereof is preferably from 150 to 3,000 (sec/10 ml), more preferably from 500 to 2,500 (sec/10 ml).

In a case where images are formed by means of an ink jet printer or a thermal transfer printer, the Bekk smoothness of the lithographic printing plate precursor surface is preferably in the range described above for the case of using liquid developer in the electrophotographic printer.

In the above described range, highly accurate toner images such as fine lines, fine letters or dots can be transferred or formed faithfully to the image receiving layer, and fixed thereto so firmly as to ensure sufficient strength in the image area.

It is more preferred that the surface of the image receiving layer has high protrusions densely. More specifically, the image receiving layer preferably has an average surface center roughness (SRa) defined in ISO-468 in the range of from 1.3 to 3.5 $\mu$m, and an average wavelength (S$\lambda$a), which indicates the density of the surface roughness, of not more than 50 $\mu$m. More preferably, the SRa is in the range of from 1.35 to 2.5 $\mu$m, and the S$\lambda$a is not more than 45 $\mu$m. It is believed that the adhesion of scattered toner to the non-image area after plate-making by electrophotography and spreading of adhered toner during fixing can be prevented owing to the use of the image receiving layer having the above described surface unevenness.

Now, the water-resistant support which can be used in the present invention will be described in more detail below.

Examples of the water-resistant support used include an aluminum plate, a zinc plate, a bimetal plate such as a copper-aluminum plate, a copper-stainless steel plate or a chromium-copper plate, and a trimetal plate such as a chromium-copper-aluminum plate, chromium-lead-iron plate or a chromium-copper-stainless steel plate, which each has a thickness of preferably from 0.1 to 3 mm, more preferably from 0.1 to 1 mm. Also, paper subjected to water-resistant treatment, paper laminated with a plastic film or a metal foil, and a plastic film each preferably having a thickness of from 80 to 200 $\mu$m are employed.

The water-resistant support has preferably a highly smooth surface. Specifically, it is desirable for the support used in the present invention that the Bekk smoothness on the surface side which is contact with the image receiving layer be adjusted to preferably at least 300 (sec/10 ml), more preferably from 900 to 3,000 (sec/10 ml), yet more preferably from 1,000 to 3,000 (sec/10 ml). By controlling the Bekk smoothness of the surface side of the support which is contact with the image receiving layer to at least 300 sec/10 ml, the image reproducibility and the printing durability can be more improved. As such improving effects can be obtained even when the image receiving layer provided thereon has the same surface smoothness, the increase in the smoothness of the support surface is considered to improve the adhesion between the image area and the image receiving layer.

The Bekk smoothness of the surface of the support can be measured in the same manner as described with respect to the image receiving layer.

The expression "highly smooth surface of the water-resistant support" as used herein means a surface coated directly with the image receiving layer. In other words, when the support has an under and/or overcoat layer, e.g., a conductive layer described below, the highly smooth surface denotes the surface of the under and/or overcoat layer.

Thus, the surface condition of the image receiving layer can be controlled and fully kept without receiving the influence of surface roughness of the support used. As a result, it becomes possible to further improve the image quality.

The adjustment of the surface smoothness to the above described range can be made using various well-known methods. For instance, the Bekk smoothness of support surface can be adjusted by coating a substrate with a resin using a melt adhesion method, or by using a strengthened calender method utilizing highly smooth heated rollers.

The lithographic printing plate precursor according to the present invention can be preferably used as a printing plate precursor for forming images on the image receiving layer provided on the water-resistant support with an electrophotographic recording system or an electrostatic ejection type ink jet recording system wherein oil-based ink is ejected utilizing an electrostatic field. The lithographic printing plate thus-prepared can provide a great number of printed matter having clear images.

In the case of utilizing the electrophotographic recording system to form images, transfer of toner images to a material to be transferred in the electrophotographic process is usually carried out electrostatically. In the above case, it is preferred that the water-resistant support is electrically conductive. Specifically, the specific electric resistance of the water-resistant support is preferably from $10^4$ to $10^{13}$ $\Omega$·cm, more preferably from $10^7$ to $10^{12}$ $\Omega$·cm. By adjusting the specific electric resistance to the above described range, blur and distortion of the transferred image and stain due to adhesion of toner to the non-image area can be restrained to a practically acceptable extent, so that the images of good quality can be obtained.

It is desirable for the water-resistant support used in the electrostatic ejection type ink jet recording system to have electric conductivity. At least in the part just under the image receiving layer, the support has the specific electric resistance of preferably not more than $10^{10}$ $\Omega$·cm. For the water-resistant support as a whole, the specific electric resistance is preferably $10^{10}$ $\Omega$·cm or below, and more preferably $10^8$ $\Omega$·cm or below. The value may be infinitely close to zero.

In the above described range of electric conductivity, the charged ink droplets just after attaching to the image receiving layer can quickly lose their electric charge through earth. Thus, clear images free from disorder can be formed.

The specific electric resistance (also referred to as volume specific electric resistance or specific resistivity, sometimes) is measured by a three-terminal method with a guard electrode according to the method described in JIS K-6911.

The electric conductivity as described above can be conferred on the support in the part just under the image receiving layer, e.g., by coating a substrate such as paper or a film with a layer comprising an electrically conductive filler such as carbon black and a binder, by sticking a metal foil on a substrate, or by vapor-evaporating a metallic film onto a substrate.

On the other hand, examples of the support that is electrically conductive as the whole include electrically conductive paper impregnated with sodium chloride, a plastic film in which an electrically conductive filler such as carbon black is mixed, and a metal plate such as an aluminum plate.

The water-resistant support having the electric conductivity which can be preferably used will be described in more detail below.

The terms "electric conductivity" and "electrically conductive" are hereinafter abbreviated as "conductivity" and "conductive" respectively.

First, the support that is conductive as the whole is described below.

Such a support can be prepared by using as a substrate a conductive base paper, such as paper impregnated with sodium chloride, and providing a conductive water-resistant layer on both sides of the substrate. Examples of paper which can be used for preparing the conductive base paper include wood pulp paper, synthetic pulp paper, and paper made from a mixture of wood pulp and synthetic pulp. It is preferred for such paper to have a thickness of 80 to 200 $\mu$m.

The formation of the conductive layer can be performed by applying a layer containing a conductive filler and a binder on the both sides of the conductive paper. The thickness of each of the conductive layer applied is preferably from 5 to 20 $\mu$m.

Examples of the conductive filler usable include granular carbon black or graphite, metal powder such as silver, copper, nickel, brass, aluminum, steel or stainless steel powder, tin oxide powder, flaky aluminum or nickel, and fibrous carbon.

The binder can be appropriately selected from various kinds of resins. Examples of a resin suitable for the binder include hydrophobic resins, for example, acrylic resins, vinyl chloride resins, styrene resins, styrene-butadiene resins, styrene-acrylic resins, urethane resins, vinylidene chloride resins and vinyl acetate resins, and hydrophilic resins, for example, polyvinyl alcohol resins, cellulose derivatives, starch and derivatives thereof, polyacrylamide resins and copolymers of styrene and maleic anhydride.

Another method for forming the conductive layer is to laminate a conductive thin film. Examples of such a conductive thin film usable include a metallic foil and a conductive plastic film. More specifically, an aluminum foil can be used for the metallic foil, and a polyethylene resin film in which carbon black is incorporated can be used for the conductive plastic film. Both hard and soft aluminum foils can be used as the laminating material. The thickness of the conductive thin films is preferably from 5 to 20 $\mu$m.

For the lamination of a polyethylene resin in which carbon black is incorporated, it is preferred to adopt an extrusion lamination method. This method includes the steps of melting the polyethylene resin by heating, forming the molten resin into a film, pressing the film immediately against the base paper and the cooling them, and can be carried out with various well-known apparatuses. The thickness of the laminated layer is preferably from 10 to 30 $\mu$m. As the support having conductivity as a whole, a conductive plastic film and a metal plate can be used as they are as far as they have a satisfactory water-resistant property.

The conductive plastic film includes, e.g., a polypropylene or polyester film in which a conductive filler such as carbon fiber or carbon black is incorporated, and the metal plate includes, e.g., an aluminum plate. The thickness of a substrate is preferably from 80 to 200 $\mu$m. When the substrate has a thickness of less than 80 $\mu$m, it may not ensure sufficient strength in the printing plate. On the other hand, when the thickness of the substrate is more than 200 $\mu$m, the handling property such as transportability in a recording apparatus may tend to decrease.

The support having a conductive layer provided on one side or both sides of the water-resistant substrate is described below.

As the water-resistant substrate, paper subjected to water-resistant treatment, paper laminated with a plastic film or a metal foil and a plastic film each preferably having a thickness of from 80 to 200 $\mu$m can be used.

As a method for forming a conductive layer on the substrate, the same methods as described in the case where the whole of the support is conductive, can be used. More specifically, the composition containing a conductive filler and a binder is coated on one side of the substrate to form a layer having a thickness of from 5 to 20 $\mu$m. Also, the conductive layer is formed by laminating a metal foil or a conductive plastic film on the substrate.

Another method which may be employed comprises depositing a metal film such as an aluminum, tin, palladium or gold film onto a plastic film.

Thus, the water-resistant support having the electrically conductive property can be obtained.

For preventing the printing plate precursor from curling, the support may have a backcoat layer (backing layer) on the side opposite to the image receiving layer. It is preferred that the backcoat layer has the Bekk smoothness of 150 to 700 (sec/10 ml) By providing such a backcoat layer on the support, the printing plate obtained can be mounted exactly in an offset printing machine without suffering shear or slippage.

The thickness of the water-resistant support provided with the under layer and/or the backcoat layer is from 90 to 130 $\mu$m, more preferably from 100 to 120 $\mu$m.

Image formation on the lithographic printing plate precursor can be performed by any appropriate method, for example, an electrophotographic recording system, an ink jet recording system or a thermal transfer recording system.

The electrophotographic recording system employed may be any of various well-known recording systems. For instance, the recording systems described, e.g., in Denshishashin Gakkai ed., *Denshishashin Gijutsu no Kiso to Oyo* (*The Fundamentals and Applications of Electrophotographic Techniques*), Corona Co. (1988), Kenichi Eda, *Denshishashin Gakkai Shi* (*Journal of Electrophotographic Society*, 27, 113 (1988), and Akio Kawamoto, ibid., 33, 149 (1994) and Akio Kawamoto, ibid., 32, 196 (1993); and commercially available PPC duplicating machines can be employed.

A combination of an exposure system in which the exposure is performed by scanning the laser beams based on digital information with a development system using a liquid developer can be adopted as an effective method for image formation, because it enables the formation of highly accurate images. One example utilizing such a combination is illustrated below.

A photosensitive material is positioned on a flat bed by a register pin system, and fixed to the flat bed by undergoing air suction from the back side. Then, the photosensitive material is charged by means of a charging device described, e.g., in the above-described reference, *The Fundamentals and Applications of Electrophotographic Techniques*, p. 212 et seq. Specifically, a corotron or scotron system is ordinarily used for charging. At the time of charging, it is also preferred to control the charging condition so that the surface potential of the photosensitive material is always kept within the intended range through a feedback system based on the information from a means of detecting the potential of the charged photosensitive material. Thereafter, the scanning exposure using a laser-beam source is performed according to, e.g., the method as described in the reference described above, p. 254 et seq.

Then, toner image formation is carried out with a liquid developer. The photosensitive material charged and exposed on the flat bed is detached from the flat bed, and subjected to wet development as described in the reference described above, p. 275 et seq. The exposure has been carried out in a mode corresponding to the toner image development mode. In the case of reversal development, for instance, a negative image, or an image area, is exposed to laser beams, a toner having the same charge polarity as the charged photosensitive material is employed, and the toner is adhered electrically to the exposed area by applying abias voltage for development. The principle of this process is explained in detail in the reference described above, p. 157 et seq.

For removal of excess developer after development, the photosensitive material is squeegeed with a rubber roller, a gap roller or a reverse roller, or subjected to corona squeegee or air squeegee as described at page 283 of the above-described reference. Before such a squeegee treatment, the photosensitive material is preferably rinsed with only a carrier liquid of the liquid developer.

Then, the toner image formed on the photosensitive material is transferred onto the lithographic printing plate precursor according to the present invention directly or via a transfer intermediate, and fixed to the printing plate precursor.

Any of conventionally known ink jet recording systems can be employed for the image formation. However, the use of oil-based ink is desirable because it ensures quick drying and satisfactory fixation of the ink image and less clogging, and the adoption of an electrostatic ejection type ink jet recording system is preferable, because such a system hardly causes blur of image. A solid jet type ink jet recording system using hot-melt ink is also preferably used.

For the ink jet recording system of on-demand type utilizing static electricity, a method called an electrostatically accelerating type ink jet or slit jet as described, for example, in Susumu Ichinose and Yuuji Ooba, Denshi Tsusin Gakkai Ronbunshi, Vol. J66-C, No. 1, page 47 (1983) and Tadayoshi Oono and Mamoru Mizuguchi, Gazo Denshi Gakkaishi, Vol. 10, No. 3, page 157 (1981) can be employed. Such an ink jet recording method is also described more specifically, for example, in JP-A-56-170, JP-A-56-4467 and JP-A-57-151374.

According to the method, ink is supplied from an ink tank to a slit-shaped ink chamber having many electrodes arranged in inner surfaces of slit-shaped ink retaining part and when a high voltage is selectively applied to each electrode, the ink neighboring to the electrode is discharged on a recording paper closely positioned against the slits, thereby conducting recording.

A method which does not use such a slit-shaped recording head is also used. In JP-A-61-211048, there is described a method in which pores of a film-like ink retainer having plural pores are filled with ink and the ink in the pores is transferred to a recording paper by applying selectively a voltage to the ink using a multi-needle electrode.

For the solid jet type ink jet recording system, commercially available printing systems such as Solid Inkjet Platemaker SJ02A (manufactured by Hitachi Koki Co., Ltd.) and MP-1200Pro (manufactured by Dynic Co., Ltd.) are employed.

A method for forming an image on the lithographic printing plate precursor according to the present invention using an ink jet recording system is described in more detail with reference to FIG. 1 to FIG. 3 below.

A device system shown in FIG. 1 comprises an ink jet recording device 1 wherein oil-based ink is used.

As shown in FIG. 1, pattern information of images (figures and letters) to be formed on a lithographic printing plate precursor (also referred to as "master" hereinafter) 2 is first supplied from an information supply source such as a computer 3 to the ink jet recording device 1 using oil-based ink through a transmission means such as a bus 4. A head for ink jet recording 10 of the recording device 1 stores oil-based ink inside. When the master 2 is passed through the ink jet recording device 1, the head 10 ejects minute droplets of the ink onto the master 2 in accordance with the above described information, whereby the ink is attached to the master 2 in the above described pattern. Thus, the image formation on the master 2 is completed, whereby the lithographic printing plate precursor having the images thereon is obtained.

Figure 2:
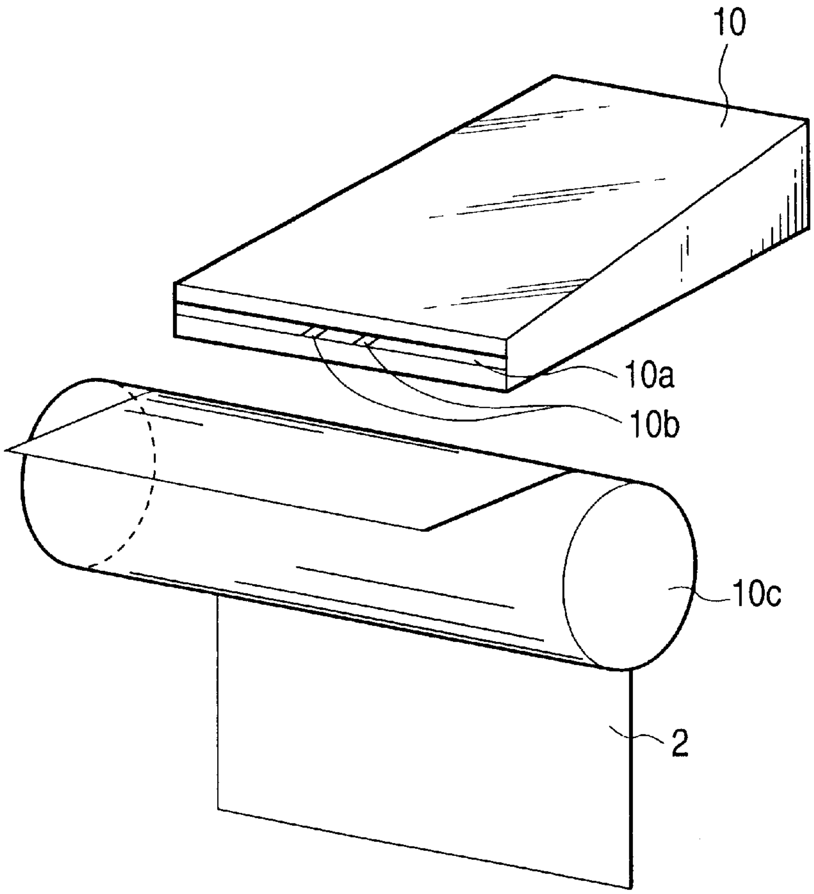
FIG. 2 is a schematic view showing the main part of an ink jet recording device which is used to form an image on the lithographic printing plate precursor according to the present invention.
Figure 3:
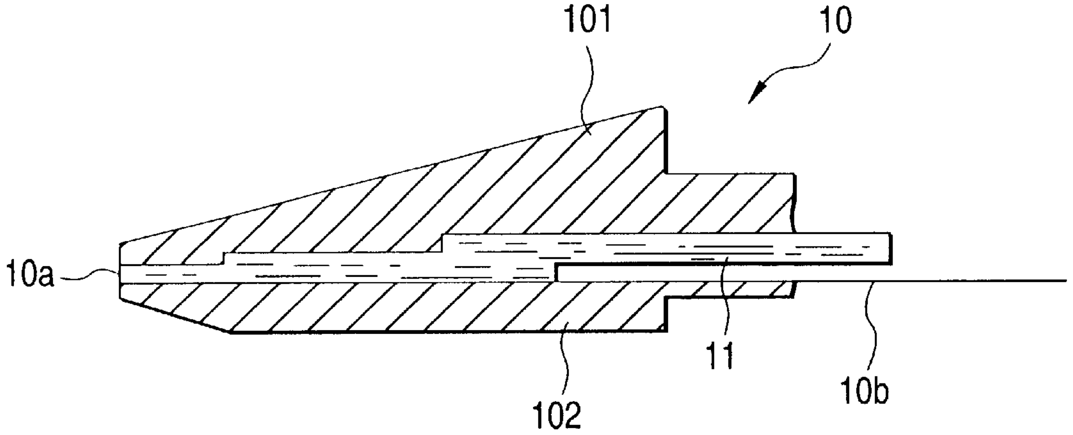
FIG. 3 is a partially cross sectional view of a head of an ink jet recording device which is used to form an image on lithographic printing plate precursor according to the invention.

One example of the ink jet recording device as shown in the device system of FIG. 1 is depicted in FIG. 2 and FIG. 3, respectively. In FIG. 2 and FIG. 3, members common to the members in FIG. 1 are designated using the same symbols, respectively.

FIG. 2 is a schematic view showing the main part of the ink jet recording device, and FIG. 3 is a partially cross sectional view of the head.

As shown in FIG. 2 and FIG. 3, the head 10 installed in the ink jet recording device has a slit between an upper unit 101 and a lower unit 102, a leading edge thereof forms an ejection slit 10*a*. Further,. an ejection electrode 10*b* is arranged in the slit, and the interior of the slit is filled with oil-based ink 11.

To the ejection electrode 10*b* of the head 10, a voltage is applied in accordance with digital signals from the pattern information of image. As shown in FIG. 2, a counter electrode 10*c* is arranged so as to face with the ejection electrode 10*b*, and the master 2 is provided on the counter electrode 10*c*. By the application of the voltage, a circuit is formed between the ejection electrode 10*b* and the counter electrode 10*c*, and the oil-based ink 11 is ejected from the ejection slit 10*a* of the head 10, thereby forming an image on the master 2 provided on the counter electrode 10*c*.

With respect to the width of the ejection electrode 10*b*, it is preferred for the leading edge thereof to be as narrow as possible in order to form an image of high quality.

For instance, print of 40 $\mu$m-dot can be formed on the master 2 by filling the head 10 as shown in FIG. 3 with the oil-based ink, disposing the ejection electrode 10*b* having a leading edge having a width of 20 $\mu$m and the counter electrode 10*c* so as to face with each other at a distance of 1.5 mm and applying a voltage of 3 KV for 0.1 millisecond between these two electrodes.

The lithographic printing plate precursor having the image formed thereon by the ink jet recording system using the oil-based ink as described above can be used as it is as a lithographic printing plate.

According to the use of the direct drawing type lithographic printing plate precursor of the present invention, images free from not only background stain over an entire surface but also dot-like stain can be formed thereon. Also, the direct drawing type lithographic printing plate precursor can prepare a lithographic printing plate providing a great number of printed matter having clear images free from disappearance or distortion of image.

The present invention will be described in greater detail with reference to the following examples, but the present invention should not be construed as being limited thereto.

EXAMPLE 1

A mixture of 100 g of titanium oxide particles (rutile type, manufactured by Wako Pure Chemical Industries, Ltd., average particle size: 0.2 μm), 113 g of a 10% by weight aqueous solution of polyvinyl alcohol (PVA 203 manufactured by Kuraray Co., Ltd.) and 300 g of an 0.1 normal aqueous solution of silver nitrate was dispersed in a paint shaker (manufactured by Toyo Seiki Co., Ltd.) for 30 minutes. With the dispersion were mixed 107 g of a 20% by weight water/ethanol (1:1) solution of tetramethoxysilane hydrolyzed previously and 182 g of a 20% aqueous solution of colloidal silica (Snowtex C manufactured by Nissan Chemical Industries, Ltd.) to prepare a coating composition for image receiving layer.

A support of ELP-1X Type Master (manufactured by Fuji Photo Film Co., Ltd.) having the Bekk smoothness of 1,000 (sec/10 ml) on the under layer side, which is used as an electrophotographic lithographic printing plate precursor for small-scale commercial printing, was employed. On the support, the coating composition for image receiving layer prepared above was coated by means of a wire bar and dried in an oven at 100° C. for 10 minutes to form an image receiving layer having a coating amount of 5 $g/m^2$. Then, the image receiving layer was irradiated with a high-pressure mercury lamp of 100 W through a pyrex filter for 2 minutes to deposit black metallic silver on the surfaces of titanium oxide particles (deposition method 1).

Reflection optical density of the lithographic printing plate precursor thus-prepared was 1.12. The measurement of reflection optical density was carried out using a densitometer having an optical system defined in ISO 5-3 and 5-4 (X-RITE densitometer) together with a neutral gray color filter covering the whole visible spectrum.

The Bekk smoothness of the surface of the lithographic printing plate precursor measured using a Bekk smoothness tester (manufactured by Kumagai Riko Co., Ltd.) under the condition of the air volume of 10 ml as described hereinbefore was 105 (sec/10 ml). Further, 2 μl of distilled water was put on the surface of the lithographic printing plate precursor, and after a 30-second lapse a contact angle of water with the lithographic printing plate precursor surface was measured with a surface contact angle meter (CA-D manufactured by Kyowa Kaimen Kagaku Co., Ltd.). The value obtained was not more than 5 degrees.

The lithographic printing plate precursor was subjected to plate-making by means of a laser printer (AMSIS 1200-J Plate Setter) with dry toner commercially available as AM-Straight Imaging System.

The quality of duplicated image on the printing plate precursor thus obtained was visually evaluated through a magnifier of 20 magnifications, and it was found that the image quality was good. Specifically, the plate-making image formed by transfer of dry toner from the laser printer had no disappearance of fine lines and fine letters, and uniform solid image area, and unevenness of toner transfer was not observed at all. Although, the background stain due to scattering of toner was slightly occurred in the non-image area, it is practically acceptable.

The lithographic printing plate precursor was subjected to plate-making in the same manner as described above. The lithographic printing plate thus prepared was then subjected to printing using a full-automatic printing machine (AM-2850 manufactured by AM Co., Ltd.), a solution prepared by diluting a PS plate processing agent (EU-3 manufactured by Fuji Photo Film Co., Ltd.) 50 times with distilled water and supplied in a dampening saucer as dampening water, and a black ink for offset printing. The 10th sheet was pickedup in the course of printing, and the printed image thereon was visually evaluated for its image quality (background stain and uniformity in solid image area) through a magnifier of 20 magnifications. The image quality was excellent.

The printing procedure was further performed in the same manner as above. As a result, more than 5,000 sheets of good prints were obtained wherein disappearance of fine lines and fine letters and unevenness in solid portion were not observed in the image area and background stain due to adhesion of printing ink was practically acceptable.

The lithographic printing plate precursor of the present invention can provide a large number of good printed matter.

COMPARATIVE EXAMPLE 1

A lithographic printing plate precursor was prepared in the same manner as in Example 1 except for using 300 g of distilled water in place of 300 g of the 0.1 normal aqueous solution of silver nitrate.

The Bekk smoothness of the surface of the lithographic printing plate precursor was 160 (sec/10 ml), and the contact angle of the surface with water was not more than 5 degrees.

The lithographic printing plate precursor was subjected to plate-making and. evaluated in the same manner as in Example 1. The quality of image formed on the printing plate precursor was almost same as that of Example 1. Specifically, the image was good and scattering of toner in the non-image area was slightly observed. As a result of the printing using the lithographic printing plate thus obtained in the same manner as in Example 1, stain was not observed in the non-image area from the beginning of printing. However, when the printing procedure was continued, disappearance of the image area occurred after printing about 1,000 sheets.

EXAMPLE 2

Preparation of Direct Drawing Type Lithographic Printing Plate Precursor

A composition having the following component was placed in a paint shaker (manufactured by Toyo Seiki Co., Ltd.) together with glass beads and dispersed for 20 minutes. Then, the glass beads were removed by filtration to obtain a dispersion.

| | |
|---|---|
| Tin oxide (manufactured by Wako Pure Chemical Industries, Ltd., average particle size: 0.1 μm) | 100 g |
| 10% Aqueous solution of gelatin (manufactured by Wako Pure Chemical Industries, Ltd.) | 300 g |
| Tetraethoxysilane | 25 g |
| Ethanol | 8.6 g |
| 20% Aqueous solution of colloidal silica (Snowtex C manufactured by Nissan Chemical Industries, Ltd.) | 182 g |
| Fluorinated alkyl ester (FC-430 manufactured by 3M Co.) | 0.25 g |

-continued

| | |
|---|---|
| Hardening compound $CH_2{=}CHSO_2CH_2CONH(CH_2)_3NHCOCH_2SO_2CH{=}CH_2$ | 1.0 g |
| 1N Hydrochloric acid | 4 g |
| 0.1N Aqueous silver nitrate solution | 250 g |

A support of ELP-2X Type Master (manufactured by Fuji Photo Film Co., Ltd.) having the Bekk smoothness of 2,000 (sec/10 ml) on the under layer side, which is used as an electrophotographic lithographic printing plate precursor for small-scale commercial printing, was employed. On the support, the coating composition prepared above was coated by means of a wire bar, set to touch and then heated at 110° C. for 30 minutes to form an image receiving layer having a coating amount of 6 g/m$^2$. Then, the irradiation procedure (deposition method 1) was conducted in the same manner as in Example 1 to deposit metallic silver on the surfaces of tin oxide particles. Thus, a lithographic printing plate precursor was prepared.

The Bekk smoothness of the surface of the lithographic printing plate precursor was 700 (sec/10 ml), and the contact angle of the surface with water was not more than 5 degrees.

Preparation of Electrophotographic Light-Sensitive Element

A mixture of 2 g of X-type metal-free phthalocyanine (manufactured by Dai-Nippon Ink & Chemicals Inc.), 14.4 g of Binder Resin (P-1) shown below, 3.6 g of Binder Resin (P-2) shown below, 0.15 g of Compound (A) shown below and 80 g of cyclohexanone was placed together with glass beads in a 500 ml of glass vessel, and dispersed for 60 minutes by a paint shaker (manufactured by Toyo Seiki Co., Ltd.). Then, the glass beads was removed by filtration to prepare a dispersion for light-sensitive layer.

Binder Resin (P-1)

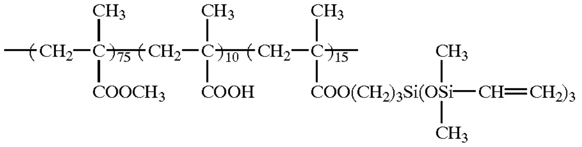

Mw: 6x10$^4$

Binder Resin (P-2)

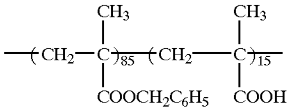

Mw: 8x10$^3$

Compound (A)

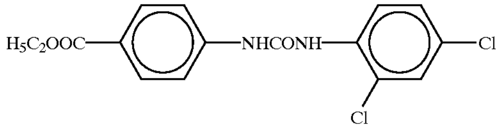

The dispersion thus prepared was coated on a 0.2 mm-thick degreased aluminum plate by means of a wire bar, set to touch, and then heated for 20 seconds in a circulation type oven regulated at 110° C. The thus-formed light-sensitive layer had a thickness of 8 μm.

The electrophotographic light-sensitive element prepared above was subjected to corona discharge in the dark to gain the surface potential of +450 V, and then to scanning-exposure by a semiconductor laser drawing device with a beam of 788 nm as an exposure apparatus. The laser beam scanning was performed on the basis of image information which was obtained by previously reading an original with a color scanner, subjecting the read image information to color separation, making some corrections relating to color reproduction of the system used, and then memorizing the corrected image information as digital image data in the internal hard disk of the system. As to the laser beam scanning condition, the beam spot diameter was 15 μm, the pitch was 10 μm and the scanning speed was 300 cm/sec (i.e., 2,500 dpi). The amount of exposure on the light-sensitive element was adjusted to 25 erg/cm$^2$.

Subsequently, the light-sensitive element exposed in the manner described above was developed with a liquid developer shown below, rinsed in a bath of Isopar G alone to remove stain in the non-image area, and dried with a hot air so that the light-sensitive element had a surface temperature of 50° C. and the amount of residual Isopar G was reduced to 10 mg per g of the toner. Then, the light-sensitive element was subjected to −6 KV precharge with a corona charging device, and the image side of the light-sensitive element was brought into face-to-face contact with the lithographic printing plate precursor described above and underwent negative corona discharge on the side of the light-sensitive element, thereby performing the image transfer.

Liquid Developer

The following ingredients were mixed and kneaded for 2 hours at 95° C. by means of a kneader to prepare a mixture. The mixture was cooled inside the kneader, and ground to powder therein. The powder in an amount of 1 parts by weight and Isopar H in an amount of 4 parts by weight were dispersed for 6 hours by a paint shaker to prepare a dispersion. The resulting dispersion was diluted with Isopar G so as to have a solid toner content of 1 g per liter and, as a charge control agent for imparting a negative charge, basic barium petronate was added thereto in an amount of 0.1 g per liter. Thus, a liquid developer was prepared.

| Ingredients to be kneaded | |
|---|---|
| Ethylene-methacrylic acid copolymer (Nucrel N-699 manufactured by Mitsui Du Pont Co.) | 4 parts by weight |
| Carbon Black #30 (manufactured by Mitsubishi Chemical Industries Ltd.) | 1 parts by weight |
| Isopar L (manufactured by Exxon Corp.) | 15 parts by weight |

The lithographic printing plate precursor having the image formed thereon was heated at 100° C. for 30 seconds, thereby fixing completely the toner image.

The image formed on the lithographic printing plate precursor was observed under an optical microscope of 200 magnifications, and the image quality was evaluated. The image obtained was clear and free from blur or disappearance of fine lines and fine letters.

Then, the lithographic printing plate was mounted in a printing machine (Oliver Model 94 manufactured by Sakurai Seisakusho Co., Ltd.), and printing was performed on sheets of printing paper using black ink for offset printing and dampening water prepared by diluting SLM-OD (manufactured by Mitsubishi Paper Mills, Ltd.) 100 times with distilled water and supplied in a dampening saucer.

The 10th printed matter was picked up in the course of printing, and the printed image thereon was evaluated by visual observation using a magnifier of 20 magnifications. The observation result indicated that the non-image area was free from background stain due to adhesion of the printing ink and the uniformity of the solid image area was good. Further, the printed matter was observed under an optical microscope of 200 magnifications. According to the observation, neither sharpening nor disappearance were found in the area of fine lines and fine letters, and the image quality of printed matter was good.

As a result of continuing the printing procedure, more than 10,000 sheets of printed matter having image quality equal to that of the 10th print were obtained.

EXAMPLE 3

Preparation of Water-Resistant Support

Wood free paper having a basis weight of 100 g/$m^2$ was used as a substrate, and a coating composition for backcoat layer shown below was coated on one side of the substrate by means of a wire bar to form a backcoat layer having a dry coating amount of12g/$m^2$. Then, the backcoat layer was subjected to a calender treatment so as to have the Bekk smoothness of about 100 (sec/10 ml).

| Coating Composition for Backcoat Layer | |
|---|---|
| Kaolin (50% aqueous dispersion) | 200 parts |
| Polyvinyl alcohol (10% aqueous solution) | 60 parts |
| SBR latex (solid content: 50%, Tg: 0° C.) | 100 parts |
| Melamine resin (solid content: 80%, Sumirez Resin SR-613) | 5 parts |

A coating composition for under layer shown below was coated on the other side of the substrate by means of a wire bar to form an under layer having a dry coating amount of 10 g/$m^2$. Then, the under layer was subjected to a calender treatment so as to have the Bekk smoothness of about 1,500 (sec/10 ml).

| Coating Composition for Under Layer | |
|---|---|
| Carbon black (30% aqueous dispersion) | 5.4 parts |
| Clay (50% aqueous dispersion) | 54.6 parts |
| SBR latex (solid content: 50%, Tg: 25° C.) | 36 parts |
| Melamine resin (solid content: 80%, Sumirez Resin SR-613) | 4 parts |

The composition described above was mixed and water was added thereto so as to have a total solid concentration of 25% to prepare the coating composition for under layer.

The measurement of specific electric resistance of the under layer was carried out in the following manner.

The coating composition for the under layer was applied to a thoroughly degreased and cleaned stainless steel plate at a dry coating amount of 10 g/$m^2$ to form a coating film. The thus formed coating film was examined for specific electric resistance in accordance with a three-terminal method with a guard electrode according to the method described in JIS K-6911. The value obtained was $4 \times 10^9$ Ω·cm.

Preparation of Direct Drawing Type Lithographic Printing Plate Precursor

A composition having the following component was placed in a paint shaker (manufactured by Toyo Seiki Co., Ltd.) together with glass beads and dispersed for 20 minutes. Then, the glass beads were removed by filtration to obtain a dispersion.

| | |
|---|---|
| Zinc oxide (manufactured by Ishihara Sangyo Kaisha, Ltd., average particle size: 0.2 μm) | 100 g |
| 10% Aqueous solution of starch (Penon ZP-2 manufactured by Nichiden Kagaku Co., Ltd.) | 300 g |
| Tetraethoxysilane | 30 g |
| Methyltrimethoxysilane | 3 g |
| 20% Aqueous solution of colloidal silica (Snowtex C manufactured by Nissan Chemical Industries, Ltd.) | 91 g |
| Ethanol | 10 g |
| 1N Hydrochloric acid | 5 g |
| 0.1N Aqueous copper sulfate solution | 300 g |

The dispersion was coated on the water-resistant support described above by means of a wire bar and dried in an oven at 100° C. for 20 minutes to form an image receiving layer having a coating amount of 6 g/$m^2$. Then, the irradiation procedure (deposition method 1) was conducted in the same manner as in Example 1 to deposit metallic copper on the surfaces of zinc oxide particles. Thus, a lithographic printing plate precursor was prepared.

Preparation of Oil-Based Ink (IK-1)

Production of Resin Particle

A mixed solution of 14 g of poly(dodecyl methacrylate), 100 g of vinyl acetate, 4.0 g of octadecyl methacrylate and 286 g of Isopar H was heated to a temperature of 70° C. under nitrogen gas stream with stirring. To the solution was added 1.5 g of 2,2'-azobis(isovaleronitrile) (abbreviated as AIVN) as a polymerization initiator, followed by reacting for 4 hours. Then, 0.8 g of 2,2'-azobis(isobutyronitrile) (abbreviated as AIBN) was added to the reaction mixture and the mixture was heated to temperature of 80° C., followed by reacting for 2 hours. Further, 0.6 g of AIBN was added to the reaction mixture, followed by reacting for 2 hours. Then, the temperature of the reaction mixture was raised to 100° C., followed by stirring for one hour, thereby distilling off the unreactedmonomers. After cooling the reaction mixture, it was passed through a nylon cloth of 200 mesh. The resulting white dispersion was a latex having a polymerization rate of 93% and an average particle size of 0.35 μm. The particle size was measured by CAPA-500 manufactured by Horiba Ltd.

Preparation of Ink

Ten grams of dodecyl methacrylate/acrylic acid copolymer (copolymerization ratio: 98/2 by weight), 10 g of Alkali Blue and 30 g of Shellsol 71 were placed in a paint shaker (manufactured by Toyo Seiki Co., Ltd.) together with glass beads and dispersed for 4 hours to obtain a blue-colored fine dispersion of Alkali Blue.

Fifty grams (as a solid basis) of the resin particles described above, 5 g (as a solid basis) of the above-described Alkali Blue dispersion and 0.06 g of zirconium naphthenate were diluted with one liter of Isopar G, thereby obtaining blue-colored Oil-Based Ink (IK-1).

A servo plotter (DA 8400 manufactured by Graphtech Co.) able to write in accordance with an output from a personal computer was converted so that an ink ejection head as shown in FIG. 2 was mounted on a pen plotter section, and the lithographic printing plate precursor described above was placed on a counter electrode positioned at a distance of 1.5 mm from the ink ejection head. Ink jet printing was performed on the lithographic printing plate precursor using Oil-Based Ink (IK-1) described above to conduct image formation. During the plate-making, the under layer provided just under the image receiving layer of the printing plate precursor was connected electrically to the counter electrode by silver paste.

Then, the printing plate precursor was heated by means of a Ricoh Fuser (manufactured by Ricoh Co., Ltd.) so as to control the surface temperature of the printing plate precursor to 70° C. for 10 seconds, thereby fixing the ink image.

The image formed on the printing plate precursor was visually observed under an optical microscope of 200 magnifications. It was found that the image was clear and neither blur nor disappearance of fine lines and fine letters were observed.

Then, the lithographic printing plate thus prepared was mounted in a printing machine (Oliver Model 94 manufactured by Sakurai Seisakusho Co., Ltd.), and printing was performed on sheets of printing paper using black ink for offset printing and dampening water prepared by diluting EU-3 (manufactured by Fuji Photo Film Co., Ltd.) 100 times with distilled water and supplied in a dampening saucer.

The 10th printed matter was picked up in the course of printing, and the printed image thereon was evaluated by visual observation using a magnifier of 20 magnifications. The observation result indicated that the non-image area was free from background stain due to adhesion of the printing ink and the uniformity of the solid image area was good. Further, the printed matter was observed under an optical microscope of 200 magnifications. According to the observation, neither sharpening nor disappearance were found in the area of fine lines and fine letters, and the image quality of printed matter was good.

As a result of continuing the printing procedure, more than 10,000 sheets of printed matter having image quality equal to that of the 10th printed matter were obtained.

EXAMPLES 4 TO 10

Lithographic printing plate precursors were prepared in the same manner as in Example 1 except for using 24 g of the organic polymer and 24 g of the silane compound shown in Table 1 below in place of polyvinyl alcohol (PVA 203) and teteramethoxysilane, respectively.

TABLE 1

| Example | Organic Polymer | Silane Compound (weight ratio) |
|---|---|---|
| 4 | Polyvinylpyrrolidone | Triethoxysilane (20%)<br>Tetramethoxysilane (80%) |
| 5 | Propyleneoxide-modified starch (PENON HV-2 manufactured by Nichiden Chemical Co., Ltd.) | Tetra(2-methoxyethoxy)-titanium (5%)<br>Tetrabutoxysilane (95%) |
| 6 | Hydroxypropylated starch (PENON LD-1 manufactured by Nichiden Chemical Co., Ltd.) | Octyltrimethoxysilane (1%)<br>Tetrapropoxysilane (99%) |
| 7 | N-Methylolacrylamide/methyl acrylate (85/15 in weight ratio) copolymer | 3-Hydroxypropyltrimethoxy-silane (5%)<br>Tetraethoxysilane (95%) |
| 8 | Polyethylene glycol 20,000 (manufactured by Wako Pure Chemical Industries, Ltd.) | Methyltrimethoxysilane (2%)<br>Tetraethoxysilane (98%) |
| 9 | Polyvinyl alcohol (PVA 405 manufactured by Kuraray Co., Ltd.) | 2-Carboxyethyltrimethoxy-silane (5%)<br>Tetraethoxysilane (95%) |
| 10 | 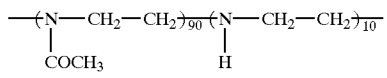<br>(weight ratio) | Tetraethoxysilane (90%)<br>3-Sulfopropyltrimethoxy-silane (10%) |

With each of the lithographic printing plate precursors, the Bekk smoothness of the surface thereof was in a range of from 120 to 150 (sec/10 ml), and the contact angle of the surface thereof with water was not more than 5 degrees.

Each of the lithographic printing plate precursor was subjected to plate-making and printing in the same manner as in Example 1. The printed matter obtained had clear images free from background stain in the non-image area similar to that obtained in Example 1. The printing durability (press life) of each lithographic printing plate was good as more than 5,000 sheets.

EXAMPLE 11

A composition having the following component was dispersed for 20 minutes using a paint shaker and coated on a support of ELP-2X Type Master by means of a wire bar, set to touch and then heated at 150° C. for 30 minutes to form an image receiving layer having a coating amount of 6 $g/m^2$. Then, the irradiation procedure (deposition method 1) was conducted in the same manner as in Example 1 to deposit metallic silver on the surfaces of zinc oxide particles. Thus, a lithographic printing plate precursor was prepared.

| Composition for Image Receiving Layer | |
|---|---|
| Zinc oxide (manufactured by Sakai Chemical Industry Co., Ltd., average particle size: 0.3 μm) | 45 g |
| Silica (Silysia 310 manufactured by Fuji Silysia Chemical Co., Ltd.) | 5 g |

-continued

| Composition for Image Receiving Layer | |
|---|---|
| Succinic acid-modified starch (PENON F3 manufactured by Nichiden Chemical Co., Ltd.) | 30 g |
| Tetraethoxysilane | 28 g |
| Benzyltrimethoxysilane | 2 g |
| 1N Hydrochloric acid | 2 g |
| 0.1N Aqueous silver nitrate solution | 300 g |

The Bekk smoothness of the surface of the lithographic printing plate precursor was 300 (sec/10 ml), and the contact angle of the surface with water was not more than 5 degrees.

The lithographic printing plate precursor was subjected to plate-making using the recording device and oil based ink described in Example 3. The image formed on the lithographic printing plate precursor was clear and free from distortion and blur in the accurate image portion such as fine lines and fine letters.

Using the printing plate thus obtained, printing was conducted in the same manner as in Example 3. The printed matter obtained had clear images free from background stain in the non-image area similar to that obtained in Example 3. The printing durability (press life) of the lithographic printing plate was good as more than 10,000 sheets.

EXAMPLES 12 TO 30

Each lithographic printing plate precursor was prepared in the same manner as in Example 3 except for using 100 g of each of the metallic compound particles shown in Table 2 below in place of 100 g of zinc oxide particles.

With each of the lithographic printing plate precursors, the Bekk smoothness of the surface thereof was in a range of from 400 to 800 (sec/10 ml), and the contact angle of the surface thereof with water was not more than 5 degrees.

Each lithographic printing plate precursor was subjected to plate-making and printing in the same manner as in Example 3. The printed matter obtained had clear images free from background stain in the non-image area and blur and distortion of fine lines and fine letters. The printing durability (press life) of each lithographic printing plate was good as more than 8,000 sheets as shown in Table 2 below.

TABLE 2

| Example | Metallic Compound Particles | Press Life (sheets) |
|---|---|---|
| 12 | Zinc sulfide (ZnS) | 12,000 |
| 13 | Zirconium oxide ($ZrO_2$) | 10,000 |
| 14 | Lead sulfide (PbS) | 15,000 |
| 15 | Bismuth oxide ($Bi_3O_2$) | 10,000 |
| 16 | Silicon carbide (SiC) | 8,000 |
| 17 | Tungsten oxide ($WO_3$) | 15,000 |
| 18 | Molybdenum disulfide ($MoS_2$) | 12,000 |
| 19 | Molybdenum selenide ($MoSe_2$) | 9,000 |
| 20 | Iron oxide ($Fe_2O_3$) | 15,000 |
| 21 | Copper oxide ($Cu_2O$) | 15,000 |
| 22 | Vanadium oxide ($V_2O_5$) | 10,000 |
| 23 | Molybdenum oxide ($MoO_3$) | 15,000 |
| 24 | Aluminum oxide ($Al_2O_3$) | 15,000 |
| 25 | Chromium oxide ($Cr_2O_3$) | 14,000 |
| 26 | Iron sulfide (FeS) | 13,000 |
| 27 | Copper sulfide (CuS) | 10,000 |
| 28 | Lead selenide (PbSe) | 15,000 |
| 29 | Copper selenide (CuSe) | 15,000 |
| 30 | Nickel oxide (NiO) | 15,000 |
| — | — | — |

EXAMPLES 31 TO 47

Each lithographic printing plate precursor was prepared in the same manner as in Example 3 except for using each of aqueous metal salt solutions shown in Table 3 below in place of the aqueous silver nitrate solution.

With each of the lithographic printing plate precursors, the Bekk smoothness of the surface thereof was in a range of from 300 to 850 (sec/10 ml), and the contact angle of the surface thereof with water was not more than 5 degrees.

Each lithographic printing plate precursor was subjected to plate-making and printing in the same manner as in Example 3. The printed matter obtained had clear images free from background stain in the non-image area and blur and distortion of fine lines and fine letters. The printing durability (press life) of each lithographic printing plate was good as more than 10,000 sheets as shown in Table 3 below.

TABLE 3

| Example | Aqueous Metal Salt Solution | Press Life (sheets) |
|---|---|---|
| 31 | 0.1 N Aqueous silver sulfate solution | 10,000 |
| 32 | 0.2 N Aqueous copper sulfate solution | 11,000 |
| 33 | 0.2 N Aqueous copper acetate solution | 10,000 |
| 34 | 0.1 N Aqueous palladium chloride solution | 12,000 |

TABLE 3-continued

| Example | Aqueous Metal Salt Solution | Press Life (sheets) |
|---|---|---|
| 35 | 0.2 N Aqueous aluminum chloride solution | 10,000 |
| 36 | 0.1 N Aqueous Vanadium chloride solution | 12,000 |
| 37 | 0.1 N Aqueous platinum sulfate solution | 10,000 |
| 38 | 0.1 N Aqueous molybdenum chloride solution | 10,000 |
| 39 | 0.2 N Aqueous yttrium sulfate solution | 11,000 |
| 40 | 0.2 N Aqueous chromium chloride solution | 10,000 |
| 41 | 0.2 N Aqueous manganese chloride solution | 10,000 |
| 42 | 0.1 N Aqueous iron chloride solution | 10,000 |
| 43 | 0.2 N Aqueous nickel nitrate solution | 15,000 |
| 44 | 0.1 N Aqueous cobalt chloride solution | 15,000 |
| 45 | 0.1 N Aqueous zinc chloride solution | 10,000 |
| 46 | 0.2 N Aqueous zirconium sulfate solution | 11,000 |
| 47 | 0.1 N Aqueous tin chloride solution | 15,000 |
| — | — | — |

EXAMPLE 48

To 600 g of an 0.1 normal aqueous solution of silver nitrate was added 200 g of titanium oxide particles (rutile type, manufactured by Wako Pure Chemical Industries, Ltd., average particle size: 0.2 μm), and the resulting mixture was irradiated with a high-pressure mercury lamp of 100 W through a pyrex filter for 3 minutes with stirring. Then, the titanium oxide particles were collected by filtration, washed with one liter of water and dried to obtain titanium oxide particles having black metallic silver deposited on the surfaces thereof (rough surface particles).

A mixture of 100 g of the titanium oxide particles obtained above, 113 g of a 10% by weight aqueous solution of polyvinyl alcohol (PVA 203 manufactured by Kuraray Co., Ltd.) and 300 g of water was dispersed in a paint shaker (manufactured by Toyo Seiki Co., Ltd.) for 30 minutes. With the dispersion were mixed 107 g of a 20% by weight water/ethanol (1:1) solution of tetramethoxysilane hydrolyzed previously and 182 g of a 20% aqueous solution of colloidal silica (Snowtex C manufactured by Nissan Chemical Industries, Ltd.) to prepare a coating composition for image receiving layer.

On a support of ELP-1X Type Master, the coating composition for image receiving layer prepared above was coated by means of a wire bar and dried in an oven at 100° C. for 10 minutes to form an image receiving layer having a coating amount of 5 $g/m^2$. Thus, a lithographic printing plate precursor was prepared.

The Bekk smoothness of the surface of the lithographic printing plate precursor was 110 (sec/10 ml), and the contact angle of the surface with water was not more than 5 degrees.

The lithographic printing plate precursor was subjected to plate-making and printing in the same manner as in Example 1. The 10th sheet was picked up in the course of printing, and the printed image thereon was visually evaluated for its image quality (background stain and uniformity in solid image area) through a magnifier of 20 magnifications. The image quality was excellent.

The printing procedure was further performed in the same manner as above. As a result, more than 5,000 sheets of good prints were obtained wherein disappearance of fine lines and fine letters and unevenness in solid portion were not observed in the image area and background stain due to adhesion of printing ink was practically acceptable.

EXAMPLE 49

To 600 g of an 0.1 normal aqueous solution of silver nitrate was added 200 g of zinc oxide particles (manufactured by Sakai Chemical Industry Co., Ltd., average particle size: 0.2 μm), and the resulting mixture was irradiated with a high-pressure mercury lamp of 100 W through a pyrex filter for 2 minutes with stirring. Then, the zinc oxide particles were collected by filtration, washed with one liter of water and dried to obtain zinc oxide particles having black metallic silver deposited on the surfaces thereof (rough surface particles).

A lithographic printing plate precursor was prepared in the same manner as in Example 48 except for using the zinc oxide particles obtained above in place of the titanium oxide particles.

The Bekk smoothness of the surface of the lithographic printing plate precursor was 125 (sec/10 ml), and the contact angle of the surface with water was not more than 5 degrees.

The lithographic printing plate precursor was subjected to plate-making using Solid Inkjet Platemaker SJ02A (manufactured by Hitachi Koki Co., Ltd.) and printing in the same manner as in Example 1. The 10th sheet was picked up in the course of printing, and the printed image thereon was visually evaluated for its image quality (background stain and uniformity in solid image area) through a magnifier of 20 magnifications. The image quality was excellent.

The printing procedure was further performed in the same manner as above. As a result, more than 5,000 sheets of good prints were obtained wherein disappearance of fine lines and fine letters and unevenness in solid portion were not observed in the image area and background stain due to adhesion of printing ink was practically acceptable.

EXAMPLES 50 TO 61

Production of Rough Surface Particles

Production of Rough Surface Particles 1

A mixture of 100 g of silica particles having an average particle size of 2 μm (Silysia manufactured by Fuji Silysia Chemical Co., Ltd.), 200 g of methanol and 20 g of 3-aminopropyltrimethoxysilane (manufactured by Chisso Corporation) was stirred for one hour, whereby the surfaces of the silica particles were subjected to coupling treatment, followed by removing the supernatant. To the residue were added 100 g of colloidal silica having an average particle size of 0.02 μm (Snowtex C manufactured by Nissan Chemical Industries, Ltd.), and the mixture was stirred for 2 hours. After allowing to stand for 10 minutes, the supernatant was removed and the residue was subjected to vacuum drying to obtain the desired rough surface particles wherein the silica particles having an average particle size of 0.02 μm adhered to the surfaces of silica particles having an average particle size of 2 μm.

Production of Rough Surface Particles 2

A mixture of 100 g of silica particles having an average particle size of 2 μm (Silysia manufactured by Fuji Silysia Chemical Co., Ltd.), 200 g of methanol and 20 g of 3-aminopropyltrimethoxysilane (manufactured by Chisso Corporation) was stirred for one hour, whereby the surfaces of the silica particles were subjected to coupling treatment, followed by removing the supernatant. To the residue were added 100 g of alumina sol having an average particle size of 0.02 μm (Alumina Sol 520 manufactured by Nissan Chemical Industries, Ltd.), and the mixture was stirred for 2 hours. After allowing to stand for 10 minutes, the supernatant was removed and the residue was subjected to vacuum drying to obtain the desired rough surface particles wherein the alumina particles having an average particle size of 0.02 μm adhered to the surfaces of silica particles having an average particle size of 2 μm.

Production of Rough Surface Particles 3

A mixture of 100 g of titanium oxide particles having an average particle size of 0.4 μm (rutile type, manufactured by Wako Pure Chemical Industries, Ltd.), 200 g of methanol and 20 g of 3-aminopropyltrimethoxysilane (manufactured by Chisso Corporation) was stirred for one hour, whereby the surfaces of the silica particles were subjected to coupling treatment, followed by removing the supernatant. To the residue were added 100 g of colloidal silica having an average particle size of 0.02 μm (Snowtex C manufactured by Nissan Chemical Industries, Ltd.), and the mixture was stirred for 2 hours. After allowing to stand for 10 minutes, the supernatant was removed and the residue was subjected to vacuum drying to obtain the desired rough surface particles wherein the silica particles having an average particle size of 0.02 μm adhered to the surfaces of titanium oxide particles having an average particle size of 0.4 μm.

Production of Rough Surface Particles 4

To a mixture of 100 g of zinc oxide particles having an average particle size of 0.4 μm (manufactured by Sakai Chemical Industry Co., Ltd.) and 200 g of distilled water was added 100 g of colloidal silica having an average particle size of 0.02 μm (Snowtex C manufactured by Nissan Chemical Industries, Ltd.), and the mixture was stirred for 2 hours. After allowing to stand for 10 minutes, the supernatant was removed and the residue was subjected to vacuum drying to obtain the desired rough surface particles wherein the silica particles having an average particle size of 0.02 μm adhered to the surfaces of zinc oxide particles having an average particle size of 0.4 μm.

Production of Rough Surface Particles 5

To a mixture of 100 g of zinc oxide particles having an average particle size of 0.4 μm (manufactured by Sakai Chemical Industry Co., Ltd.) and 200 g of distilled water was added 100 g of alumina sol having an average particle size of 0.02 μm (Alumina Sol 520 manufactured by Nissan Chemical Industries, Ltd.), and the mixture was stirred for 2 hours. After allowing to stand for 10 minutes, the supernatant was removed and the residue was subjected to vacuum drying to obtain the desired rough surface particles wherein the alumina particles having an average particle size of 0.02 μm adhered to the surfaces of zinc oxide particles having an average particle size of 0.4 μm.

Production of Rough Surface Particles 6

To a mixture of 100 g of styrene-butadiene latex having an average particle size of 0.16 μm (Nipol LX 303 manufactured by Nippon Zeon Co., Ltd.) and 100 g of distilled water was added 100 g of colloidal silica having an average particle size of 0.02 μm (Snowtex C manufactured by Nissan Chemical Industries, Ltd.), and the mixture was stirred at room temperature for 2 hours to obtain a latex of the desired rough surface particles wherein the silica particles having an average particle size of 0.02 μm adhered to the surfaces of styrene-butadiene particles having an average particle size of 0.16 μm.

Production of Rough Surface Particles 7

A mixture of 100 g of silica particles having an average particle size of 2 μm (Silysia manufactured by Fuji Silysia Chemical Co., Ltd.) with 500 g of a 1 normal aqueous sodium hydroxide solution was subjected to ultrasonic treatment to render the surfaces thereof hydrophilic, followed by removing the supernatant. The residue was washed with water and 200 g of methanol and 20 g of 3-glycidoxypropyltrimethoxysilane (manufactured by Chisso Corporation) were added thereto. The mixture was stirred for one hour, whereby the surfaces of the silica particles were subjected to coupling treatment, followed by removing the supernatant. Separately, a mixture of 100 g of titania particles having an average particle size of 0.01 μm (STS 01 manufactured by Ishihara Sangyo Kaisha, Ltd.), 200 g of methanol and 20 g 3-aminopropyltrimethoxysilane (manufactured by Chisso Corporation) was stirred for one hour, whereby the surfaces of the silica particles were subjected to coupling treatment. Then, 100 g of the silica particles described above was added thereto and the mixture was stirred for 2 hours. After allowing to stand for 10 minute, the supernatant was removed and the residue was subjected to vacuum drying to obtain the desired rough surface particles wherein the titania particles having an average particle size of 0.01 μm adhered to the surfaces of silica particles having an average particle size of 2 μm.

Production of Rough Surface Particles 8

A mixture of 70% by weight of crosslinked acrylate particles having an average particle size of 1.5 μm (MX-150 manufactured by Soken Chemical Co., Ltd.) and 30% by weight of silica particles having an average particle size of 0.01 μm (Aerosil MOX 170 manufactured by Nippon Aerosil Co., Ltd.) was subjected to treatment with a dry type aggregation stirring method using a hybridizer at 16,000 rpm for 5 minutes to obtain the desired rough surface particles.

Production of Rough Surface Particles 9

A mixture of 70% by weight of crosslinked acrylate particles having an average particle size of 1.5 μm (MX-150 manufactured by Soken Chemical Co., Ltd.) and 30% by weight of titanium oxide particles having an average particle size of 0.01 μm (ST 01 manufactured by Ishihara Sangyo Kaisha, Ltd.) was subjected to treatment with a dry type aggregation stirring method using a hybridizer at 16,000 rpm for 5 minutes to obtain the desired rough surface particles.

Production of Rough Surface Particles 10

A mixture of 70% by weight of crosslinked acrylate particles having an average particle size of 1.5 μm (MX-150 manufactured by Soken Chemical Co., Ltd.) and 30% by weight of zinc oxide particles having an average particle size of 0.02 μm (Finex-50 manufactured by Sakai Chemical Industry Co., Ltd.) was subjected to treatment with a dry type aggregation stirring method using a hybridizer at 16,000 rpm for 5 minutes to obtain the desired rough surface particles.

Production of Rough Surface Particles 11

A mixture of 70% by weight of polymethyl methacrylate particles having an average particle size of 0.4 μm (MP-1000 manufactured by Soken Chemical Co., Ltd.) and 30% by weight of silica particles having an average particle size of 0.01 μm (Aerosil MOX 170 manufactured by Nippon Aerosil Co., Ltd.) was subjected to treatment with a dry type aggregation stirring method using a hybridizer at 16,000 rpm for 5 minutes to obtain the desired rough surface particles.

Production of Rough Surface Particles 12

A mixture of 70% by weight of silica particles having an average particle size of 2 μm (Silysia manufactured by Fuji Silysia Chemical Co., Ltd.) and 30% by weight of silica particles having an average particle size of 0.01 μm (Aerosil MOX 170 manufactured by Nippon Aerosil Co., Ltd.) was subjected to treatment with a dry type aggregation stirring method using a hybridizer at 16,000 rpm for 5 minutes to obtain the desired rough surface particles.

Preparation of Direct Drawing Type Lithographic Printing Plate Precursor

A composition having the following component was placed in a paint shaker (manufactured by Toyo Seiki Co., Ltd.) together with glass beads and dispersed for 20 minutes. Then, the glass beads were removed by filtration to obtain a dispersion.

| | |
|---|---|
| Rough Surface Particles (as shown in Table 4 below) | 100 g |
| 10% Aqueous solution of gelatin (manufactured by Wako Pure Chemical Industries, Ltd.) | 300 g |
| Tetraethoxysilane | 30 g |
| Ethanol | 8.6 g |
| 20% Aqueous solution of colloidal silica (Snowtex C manufactured by Nissan Chemical Industries, Ltd.) | 182 g |
| Fluorinated alkyl ester (FC-430 manufactured by 3M Co.) | 0.25 g |
| Hardening compound $CH_2{=}CHSO_2CH_2CONH(CH_2)_3NHCOCH_2SO_2CH{=}CH_2$ | 1.0 g |
| 1N Hydrochloric acid | 4 g |
| Water | 150 g |

TABLE 4

| Example | Rough Surface Particles | Example | Rough Surface Particles |
|---|---|---|---|
| 50 | 1 | 56 | 7 |
| 51 | 2 | 57 | 8 |
| 52 | 3 | 58 | 9 |
| 53 | 4 | 59 | 10 |
| 54 | 5 | 60 | 11 |
| 55 | 6 | 61 | 12 |

Each of the coating compositions prepared above was coated on a support of ELP-2X Type Master by means of a wire bar, set to touch and then heated at 100° C. for 5 minutes to form an image receiving layer having a coating amount of 6 g/$m^2$ to prepare a lithographic printing plate precursor.

With each of the lithographic printing plate precursors, the Bekk smoothness of the surface thereof was in a range of from 600 to 800 (sec/10 ml), and the contact angle of the surface with water was not more than 5 degrees.

The lithographic printing plate precursor was subjected to plate-making by means of a laser printer (AMSIS 1200-J Plate Setter) with dry toner commercially available as AM-Straight Imaging System.

The quality of duplicated image on the printing plate precursor thus obtained was visually evaluated through a magnifier of 20 magnifications, and it was found that the image quality was good. Specifically, the plate-making image formed by transfer of dry toner from the laser printer had no disappearance of fine lines and fine letters and had uniform solid image area, and unevenness of toner transfer was not observed at all. Although, the background stain due to scattering of toner was slightly occurred in the non-image area, it is practically acceptable.

The lithographic printing plate precursor was subjected to plate-making in the same manner as described above. The lithographic printing plate thus prepared was then subjected to printing using a full-automatic printing machine (AM-2850 manufactured by AM Co., Ltd.), a solution prepared by diluting a PS plate processing agent (EU-3 manufactured by Fuji Photo Film Co., Ltd.) 50 times with distilled water and supplied in a dampening saucer as dampening water, and a black ink for offset printing. The 10th sheet was picked up in the course of printing, and the printed image thereon was visually evaluated for its image quality (background stain and uniformity in solid image area) through a magnifier of 20 magnifications. The image quality was excellent.

The printing procedure was further performed in the same manner as above. As a result, more than 5,000 sheets of good prints were obtained wherein disappearance of fine lines and fine letters and unevenness in solid portion were not observed in the image area and background stain due to adhesion of printing ink was not recognized in the non-image area.

The lithographic printing plate precursors of the present invention can provide a large number of good printed matter.

COMPARATIVE EXAMPLE 2

A lithographic printing plate precursor was prepared in the same manner as in Example 52 except for using titanium oxide particles having an average particle size of 0.4 μm (rutile type, manufactured by Wako Pure Chemical Industries, Ltd.) in place of Rough Surface Particles 3.

The Bekk smoothness of the surface of the lithographic printing plate precursor was 600 (sec/10 ml), and the contact angle of the surface with water was not more than 5 degrees.

The lithographic printing plate precursor was subjected to plate-making and evaluated in the same manner as in Example 52. The quality of image formed on the printing plate precursor was similar to that of Example 52. Specifically, the image was good and scattering of toner in the non-image area was slightly observed. However, as a result of the printing using the lithographic printing plate thus obtained in the same manner as in Example 52, dot-like stains were slightly observed in the non-image area from the beginning of printing. Further, when the printing procedure was continued, disappearance of the image area occurred after printing about 1,000 sheets.

EXAMPLES 62 TO 73

Preparation of Water-Resistant Support

Wood free paper having a basis weight of 100 g $m^2$was used as a substrate, and a coating composition for backcoat layer shown below was coated on one side of the substrate by means of a wire bar to form a backcoat layer having a dry coating amount of 12 g/$m^2$. Then, the backcoat layer was subjected to a calender treatment so as to have the Bekk smoothness of about 100 (sec/10 ml).

| Coating Composition for Backcoat Layer | |
|---|---|
| Kaolin (50% aqueous dispersion) | 200 parts |
| Polyvinyl alcohol (10% aqueous solution) | 60 parts |
| SBR latex (solid content: 50%, Tg: ° C.) | 100 parts |
| Melamine resin (solid content: 80%, Sumirez Resin SR-613) | 5 parts |

A coating composition for under layer shown below was coated on the other side of the substrate by means of a wire bar to form an under layer having a dry coating amount of 10 g/$m^2$. Then, the under layer was subjected to a calender treatment so as to have the Bekk smoothness of about 1,500 (sec/10 ml).

| Coating Composition for Under Layer | |
|---|---|
| Carbon black (30% aqueous dispersion) | 5.4 parts |
| Clay (50% aqueous dispersion) | 54.6 parts |
| SBR latex (solid content: 50%, Tg: 25° C.) | 36 parts |
| Melamine resin (solid content: 80%, Sumirez Resin SR-613) | 4 parts |

The composition described above was mixed and water was added thereto so as to have a total solid concentration of 25% to prepare the coating composition for under layer.

The measurement of specific electric resistance of the under layer was carried out in the following manner.

The coating composition for the under layer was applied to a thoroughly degreased and cleaned stainless steel plate at a dry coating amount of 10 g/$m^2$ to form a coating film. The thus formed coating film was examined for specific electric resistance in accordance with a three-terminal method with a guard electrode according to the method described in JIS K-6911. The value obtained was $4\times10^9$ Ω·cm.

Preparation of Direct Drawing Type Lithographic Printing Plate Precursor

A composition having the following component was placed in a paint shaker (manufactured by Toyo Seiki Co., Ltd.) together with glass beads and dispersed for 20 minutes. Then, the glass beads were removed by filtration to obtain a dispersion.

| | |
|---|---|
| Rough Surface Particles (as shown in Table 5 below) | 100 g |
| 10% Aqueous solution of polyvinyl alcohol (PVA 117 manufactured by Kuraray Co., Ltd.) | 100 g |
| Tetraethoxysilane | 30 g |
| Methyltrimethoxysilane | 3 g |
| 20% Aqueous solution of colloidal silica (Snowtex C manufactured by Nissan Chemical Industries, Ltd.) | 91 g |
| Ethanol | 10 g |
| 1N Hydrochloric acid | 5 g |
| Water | 200 g |

TABLE 5

| Example | Rough Surface Particles |
|---|---|
| 62 | 1 |
| 63 | 2 |
| 64 | 3 |
| 65 | 4 |
| 66 | 5 |
| 67 | 6 |
| 68 | 7 |
| 69 | 8 |
| 70 | 9 |
| 71 | 10 |
| 72 | 11 |
| 73 | 12 |

Each of the coating compositions prepared above was coated on the water-resistant support described above by means of a wire bar and dried in an oven at 100° C. for 20 minutes to from an image receiving layer having a coating amount of 6 g/$m^2$ to prepare a lithographic printing plate precursor.

With each of the lithographic printing plate precursors, the Bekk smoothness of the surface thereof was in a range of from 600 to 800 (sec/10 ml), and the contact angle of the surface with water was not more than 5 degrees.

Preparation of Oil-Based Ink (IK-2)

Production of Resin Particle

A mixed solution of 14 g of poly(dodecyl methacrylate), 30 g of methyl methacrylate, 66 g of methyl acrylate, 4.0 g of octadecyl methacrylate and 286 g of Isopar H was heated to a temperature of 70° C. under nitrogen gas stream with stirring.

To the solution was added 1.5 g of 2,2'-azobis(isovaleronitrile) (abbreviated as AIVN) as a polymerization initiator, followed by reacting for 4 hours. Then, 0.8 g of 2,2,'-azobis (isobutyronitrile) (abbreviated as AIBN) was added to the reaction mixture and the mixture was heated to temperature of 80° C., followed by reacting for 2 hours. Further, 0.6 g of AIBN was added to the reaction mixture, followed by reacting for 2 hours. Then, the temperature of the reaction mixture was raised to 100° C., followed by stirring for one hour, thereby distilling off the unreacted monomers. After cooling the reaction mixture, it was passed through a nylon cloth of 200 mesh. The resulting white dispersion was a latex having a polymerization rate of 95% and an average particle size of 0.34 μm. The particle size was measured by CAPA-500 manufactured by Horiba Ltd.

Preparation of Ink

Ten grams of dodecyl methacrylate/acrylic acid copolymer (copolymerization ratio: 98/2 by weight), 10 g of nigrosine and 30 g of Isopar H were placed in a paint shaker (manufactured by Toyo Seiki Co., Ltd.) together with glass beads and dispersed for 4 hours to obtain a black-colored fine dispersion of nigrosine.

Fifty grams (as a solid basis) of the resin particles described above, 5 g (as a solid basis) of the above-described nigrosine dispersion and 0.5 g of cobalt dodecanoate were diluted with one liter of Isopar G, thereby obtaining black-colored Oil-Based Ink (IK-2).

A servo plotter (DA 8400 manufactured by Graphtech Co.) able to write in accordance with an output from a personal computer was converted so that an ink ejection head as shown in FIG. 2 was mounted on a pen plotter section, and the lithographic printing plate precursor described above was placed on a counter electrode positioned at a distance of 1.5 mm from the ink ejection head. Ink jet printing was performed on the lithographic printing plate precursor using Oil-Based Ink (IK-2) described above to conduct image formation. During the plate-making, the under layer provided just under the image receiving layer of the printing plate precursor was connected electrically to the counter electrode by silver paste.

Then, the printing plate precursor was heated by means of a Ricoh Fuser (manufactured by Ricoh Co., Ltd.) so as to control the surface temperature of the printing plate precursor to 70° C. for 10 seconds, thereby fixing the ink image.

The image formed on the printing plate precursor was visually observed under an optical microscope of 200 magnifications. It was found that the image was clear and neither blur nor disappearance of fine lines and fine letters were observed.

Then, the lithographic printing plate thus prepared was mounted in a printing machine (Oliver Model 94 manufactured by Sakurai Seisakusho Co., Ltd.), and printing was performed on sheets of printing paper using black ink for offset printing and dampening water prepared by diluting EU-3 (manufactured by Fuji Photo Film Co., Ltd.) 100 times with distilled water and supplied in a dampening saucer.

The 10th printed matter was picked up in the course of printing, and the printed image thereon was evaluated by visual observation using a magnifier of 20 magnifications. The observation result indicated that the non-image area was free from background stain due to adhesion of the printing ink and the uniformity of the solid image area was good. Further, the printed matter was observed under an optical microscope of 200 magnifications. According to the observation, neither sharpening nor disappearance were found in the area of fine lines and fine letters, and the image quality of printed matter was good.

As a result of continuing the printing procedure, more than 10,000 sheets of printed matter having image quality equal to that of the 10th printed matter were obtained.

COMPARATIVE EXAMPLE 3

A lithographic printing plate precursor was prepared in the same manner as in Example 62 except for using silica particles having an average particle size of 2 μm (Silysia manufactured by Fuji Silysia Chemical Co., Ltd.) in place of Rough Surface Particles 1.

The Bekk smoothness of the surface of the lithographic printing plate precursor was 600 (sec/10 ml), and the contact angle of the surface with water was not more than 5 degrees.

The lithographic printing plate precursor was subjected to plate-making and evaluated in the same manner as in Example 62. The quality of image formed on the printing plate precursor was almost same as that of Example 62. Specifically, the image was good and scattering of toner in the non-image area was slightly observed. However, as a result of the printing using the lithographic printing plate thus obtained in the same manner as in Example 62, disappearance of the image area occurred after printing about 1,000 sheets.

EXAMPLE 74

The direct drawing type printing plate precursor described in Example 50 was subjected to plate-making by means of a ink jet plate-making machine using solid ink (Solid Inkjet Platemaker SJ 120 manufactured by Hitachi Koki Co., Ltd.).

The quality of duplicated image on the printing plate precursor thus obtained was visually evaluated through a magnifier of 20 magnifications, and it was found that the image quality was good. Specifically, the plate-making image formed by the ink jet plate-making machine using solid ink had no disappearance of fine lines and fine letters and had uniform solid image area. Further, the background stain due to scattering of the ink was not occurred in the non-image area.

The lithographic printing plate precursor was subjected to plate-making in the same manner as described above. The lithographic printing plate thus prepared was then subjected to printing using a full-automatic printing machine (AM-2850 manufactured by AM Co., Ltd.), a solution prepared by diluting a PS plate processing agent (EU-3 manufactured by Fuji Photo Film Co., Ltd.) 50 times with distilled water and supplied in a dampening saucer as dampening water, and a black ink for offset printing. The 10th sheet was picked up in the course of printing, and the printed image thereon was visually evaluated for its image quality (background stain and uniformity in solid image area) through a magnifier of 20 magnifications. The image quality was excellent.

The printing procedure was further performed in the same manner as above. As a result, more than 5,000 sheets of good prints were obtained wherein disappearance of fine lines and fine letters and unevenness in solid portion were not observed in the image area and background stain due to adhesion of printing ink was not recognized in the non-image area.

The lithographic printing plate precursors of the present invention can provide a large number of good printed matter.

While the invention has been described in detail and with reference to specific examples thereof, it will be apparent to one skilled in the art that various changes and modifications can be made therein without departing from the spirit and scope thereof.

What is claimed is:

1. A direct drawing type lithographic printing plate precursor comprising a water-resistant support having provided thereon an image receiving layer, wherein the image receiving layer comprises particles having rough surface composed of core particles having on the surfaces thereof fine particles adhered, and a binder resin comprising a complex composed of a resin containing a siloxane bond in which a silicon atom is connected with an oxygen atom and an organic polymer containing a group capable of forming a hydrogen bond with the resin containing a siloxane bond.

2. The direct drawing type lithographic printing plate precursor as claimed in claim 1, wherein an average particle size of the fine particles is ⅓ or less of an average particle size of the core particles.

3. The direct drawing type lithographic printing plate precursor as claimed in claim 1, wherein an average particle size of the particles having rough surface is 15 μm or less.

4. The direct drawing type lithographic printing plate precursor as claimed in claim 1, wherein the particles having rough surface are metallic compound particles having photo-catalytic property and bearing on the surfaces thereof minute flakes of metallic substance.

5. The direct drawing type lithographic printing plate precursor as claimed in claim 4, wherein the minute flakes of metallic substance born on the surfaces of the metallic compound particles having photo-catalytic property are minute flakes of elemental metal deposited on the surfaces of the metallic compound particles upon irradiation with an active ray in the presence of a salt of the elemental metal which has an ionization tendency smaller than a hydrogen atom.

6. The direct drawing type lithographic printing plate precursor as claimed in claim 4, wherein the metallic compound particles having photo-catalytic property are particles of a member selected from the group consisting of $TiO_2$, $RTiO_3$ (wherein R represents an alkaline earth metal atom), $AB_{2-x}C_xD_{3-x}E_xO_{10}$ (wherein A represents a hydrogen atom or an alkali metal atom; B represents an alkaline earth metal atom or a lead atom); C represents a rare earth atom; D represents a metal atom belonging to Group 5A of the periodic table; E represents a metal atom belonging to Group 4 of the periodic table; and x represents a number of from 0 to 2), $SnO_2$, $ZrO_2$, ZnO, $Bi_2O_3$, $WO_3$, $Fe_2O_3$, $CU_2O$, $V_2O_5$, $MoO_3$, $Al_2O_3$, $Cr_2O_3$, ZnS, $MOS_2$, FeS, CuS, PbS, $MoSe_2$, PbSe, CuSe and SiC.

7. The direct drawing type lithographic printing plate precursor as claimed in claim 1, wherein the resin containing a siloxane bond is a polymer formed by a hydrolysis polymerization condensation reaction of at least one silane compound represented by the following formula (I):

$$(R^0)_nSi(Y)_{4-n} \qquad (I)$$

wherein $R^0$ represents a hydrogen atoms, a hydrocarbon group or a heterocyclic group; Y represents a hydrogen atom, a halogen atom, $—OR^1$, $—OCOR^2$ or $—N(R^3)(R^4)$ (wherein $R^1$ and $R^2$ each represents a hydrocarbon group; and $R^3$ and $R^4$, which may be the same or different, each represents a hydrogen atom or a hydrocarbon group); and n represents 0, 1 or 2, provided that the Si atom is not connected to three or more hydrogen atoms.

8. The direct drawing type lithographic printing plate precursor as claimed in claim 1, wherein the image-receiving layer has a surface smoothness of not less than 30 seconds/10 ml in terms of Bekk smoothness.

9. The direct drawing type lithographic printing plate precursor as claimed in claim 1, wherein the organic polymer containing a group capable of forming a hydrogen bond with the resin containing a siloxane bond is a polymer containing at least one member selected from the group consisting of an amido bond, a urethane bond, a ureido bond and a hydroxy group.

10. The direct drawing type lithographic printing plate precursor as claimed in claim 9, wherein the organic polymer is an amide resin having an $—N(R^{11})CO—$ or $—N(R^{11})SO_2—$ bond wherein $R^{11}$ represents a hydrogen atom, a hydrocarbon group or a heterocyclic group, a ureide resin having an —NHCONH— bond, or a urethane resin having an —NHCOO— bond.

11. The direct drawing type lithographic printing plate precursor as claimed in claim 9, wherein the organic polymer is a polymer containing a repeating unit represented by the following formula (II):

(II)

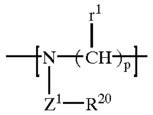

wherein, $Z^1$ represents —CO— or —CS—; $R^{20}$ represents a hydrogen atom, a hydrocarbon group or a heterocyclic group; $r^1$ represents a hydrogen atom or an alkyl group having from 1 to 6 carbon atoms, $r^1$s may be the same or different; and p represents an integer of 2 or 3.

12. The direct drawing type lithographic printing plate precursor as claimed in claim 1, wherein the complex has a weight ratio of the siloxane polymer/organic polymer of from 10/90 to 90/10.

13. The direct drawing type lithographic printing plate precursor as claimed in claim 1, wherein the image-receiving layer has a surface of high protrusions densely.

14. The direct drawing type lithographic printing plate precursor as claimed in claim 13, wherein the image-receiving layer has an average surface center roughness (SRa) defined in ISO-468 in the range of from 1.3 to 3.5 μm, and an average wavelength (Sλa) of not more than 50 μm.

15. The direct drawing type lithographic printing plate precursor as claimed in claim 1, wherein the image receiving layer has a thickness of from 0.2 to 10 μm.

16. The direct drawing type lithographic printing plate precursor as claimed in claim 1, wherein the water-resistant support has a surface smoothness of not less than 300 seconds/10 ml in terms of a Bekk smoothness.

17. The direct drawing type lithographic printing plate precursor as claimed in claim 1, wherein the water-resistant support has specific electric resistance of from $10^4$ to $10^{13}$ Ω•cm.

18. A method of preparing a direct drawing type lithographic printing plate precursor comprising irradiating a plate comprising a water-resistant support having provided thereon an image receiving layer, wherein the image receiving layer comprises a salt of metal which has an ionization tendency smaller than a hydrogen atom, metallic compound particles having photo-catalytic property and a binder resin comprising a complex composed of a resin containing a siloxane bond in which a silicon atom is connected with an oxygen atom and an organic polymer containing a group capable of forming a hydrogen bond with the resin containing a siloxane bond with an active ray.

* * * * *